(12) United States Patent
Ikeda et al.

(10) Patent No.: US 7,772,111 B2
(45) Date of Patent: *Aug. 10, 2010

(54) SUBSTRATE PROCESSING METHOD AND FABRICATION PROCESS OF A SEMICONDUCTOR DEVICE

(75) Inventors: Taro Ikeda, Nirasaki (JP); Tadahiro Ishizaka, Albany, NY (US); Masamichi Hara, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 316 days.

This patent is subject to a terminal disclaimer.

(21) Appl. No.: 11/673,628

(22) Filed: Feb. 12, 2007

(65) Prior Publication Data

US 2007/0134907 A1    Jun. 14, 2007

Related U.S. Application Data

(62) Division of application No. 11/142,457, filed on Jun. 2, 2005, now Pat. No. 7,332,426.

(30) Foreign Application Priority Data

Jun. 2, 2004    (JP) .............................. 2004-164521

(51) Int. Cl.
H01L 21/4763    (2006.01)
(52) U.S. Cl. ...................... 438/637; 438/653; 438/622; 438/675; 438/475; 438/620; 438/627; 438/639; 438/643; 257/758; 257/774
(58) Field of Classification Search ................ 438/618, 438/622, 653, 675, 475, 620, 627, 629, 637, 438/639, 643, 669, FOR. 448; 257/758, 257/774, 751, E21.212
See application file for complete search history.

(56) References Cited

U.S. PATENT DOCUMENTS

| 6,033,990 | A | 3/2000 | Kishimoto et al. |
| 6,204,192 | B1 | 3/2001 | Zhao et al. |
| 6,638,859 | B2 | 10/2003 | Sneh et al. |
| 6,693,030 | B1 | 2/2004 | Subrahmanyan et al. |

(Continued)

FOREIGN PATENT DOCUMENTS

JP    10-256232    9/1998

(Continued)

*Primary Examiner*—Thao X Le
*Assistant Examiner*—Thanh Y Tran
(74) *Attorney, Agent, or Firm*—Oblon, Spivak, McClelland, Maier & Neustadt, L.L.P.

(57) ABSTRACT

A method of fabricating a semiconductor device includes the steps of forming a via-hole in an interlayer insulation film such that a metal interconnection pattern formed underneath the interlayer insulation film is exposed at a bottom of the via-hole, forming a conductive barrier film on the interlayer insulation film so as to cover a sidewall surface of the via-hole and the exposed metal interconnection pattern in conformity with a shape of the via-hole and forming a metal film on the conductive barrier film, wherein there is provided a preprocessing step, after the step of forming the via-hole but before the step of forming the conductive barrier film, of processing the interlayer insulation film including the sidewall surface of the via-hole and a bottom surface of the via-hole, with plasma containing hydrogen having energy not causing sputtering of the metal interconnection pattern.

12 Claims, 22 Drawing Sheets

U.S. PATENT DOCUMENTS

| | | | |
|---|---|---|---|
| 6,949,472 B1 * | 9/2005 | Huang et al. | 438/758 |
| 7,332,426 B2 * | 2/2008 | Ikeda et al. | 438/618 |
| 2003/0236003 A1 * | 12/2003 | Koo et al. | 438/795 |
| 2006/0165873 A1 * | 7/2006 | Rueger et al. | 427/8 |

FOREIGN PATENT DOCUMENTS

| | | |
|---|---|---|
| JP | 2000-58536 | 2/2000 |
| JP | 2000-332112 | 11/2000 |
| JP | 2002-500276 | 1/2002 |
| JP | 2002-370059 | 12/2002 |
| JP | 2003-77976 | 3/2003 |

* cited by examiner

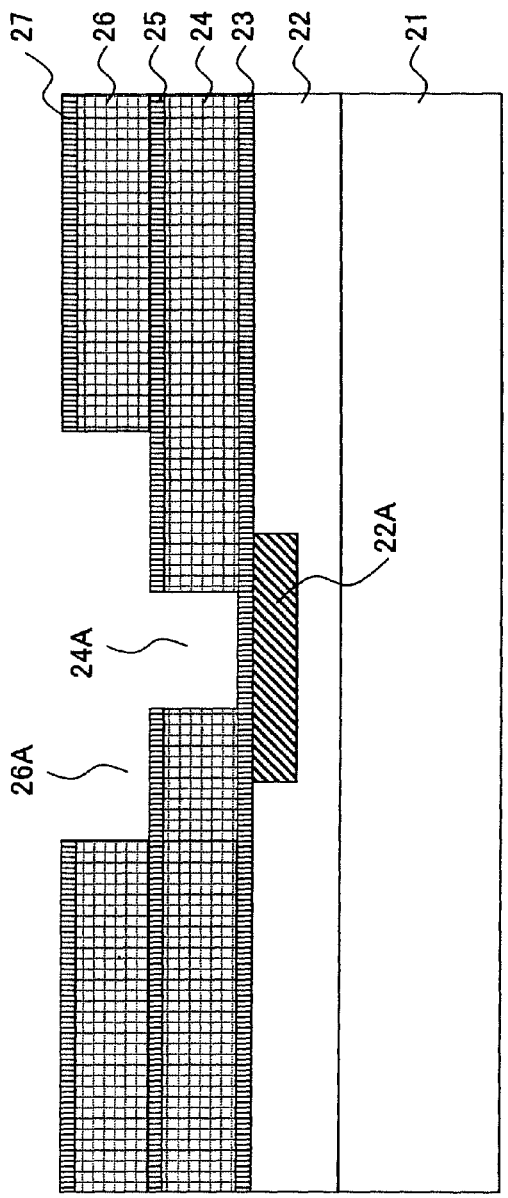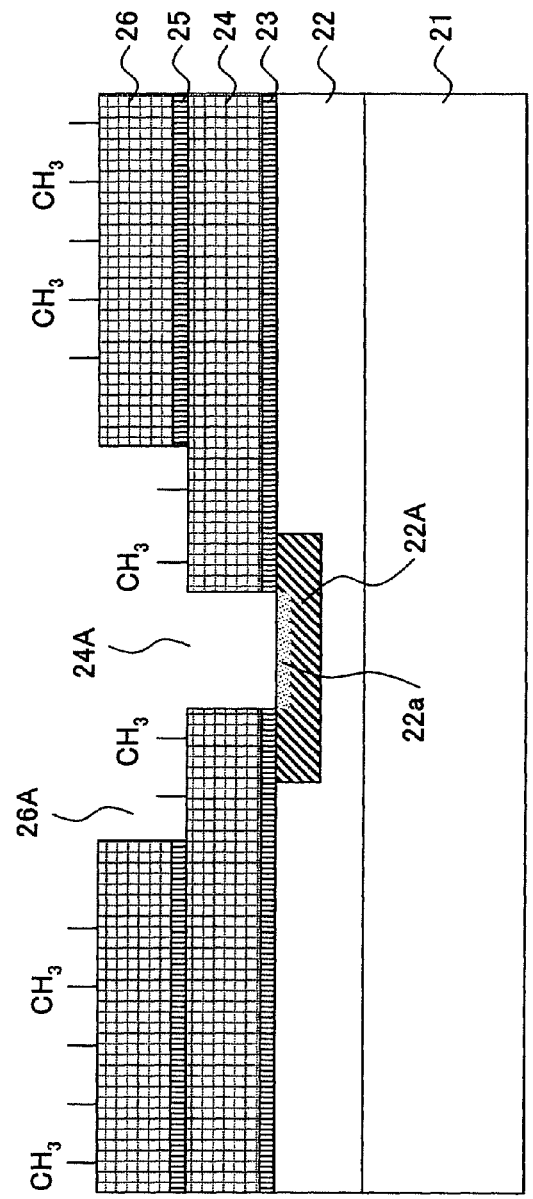
FIG.6C
FIG.6D

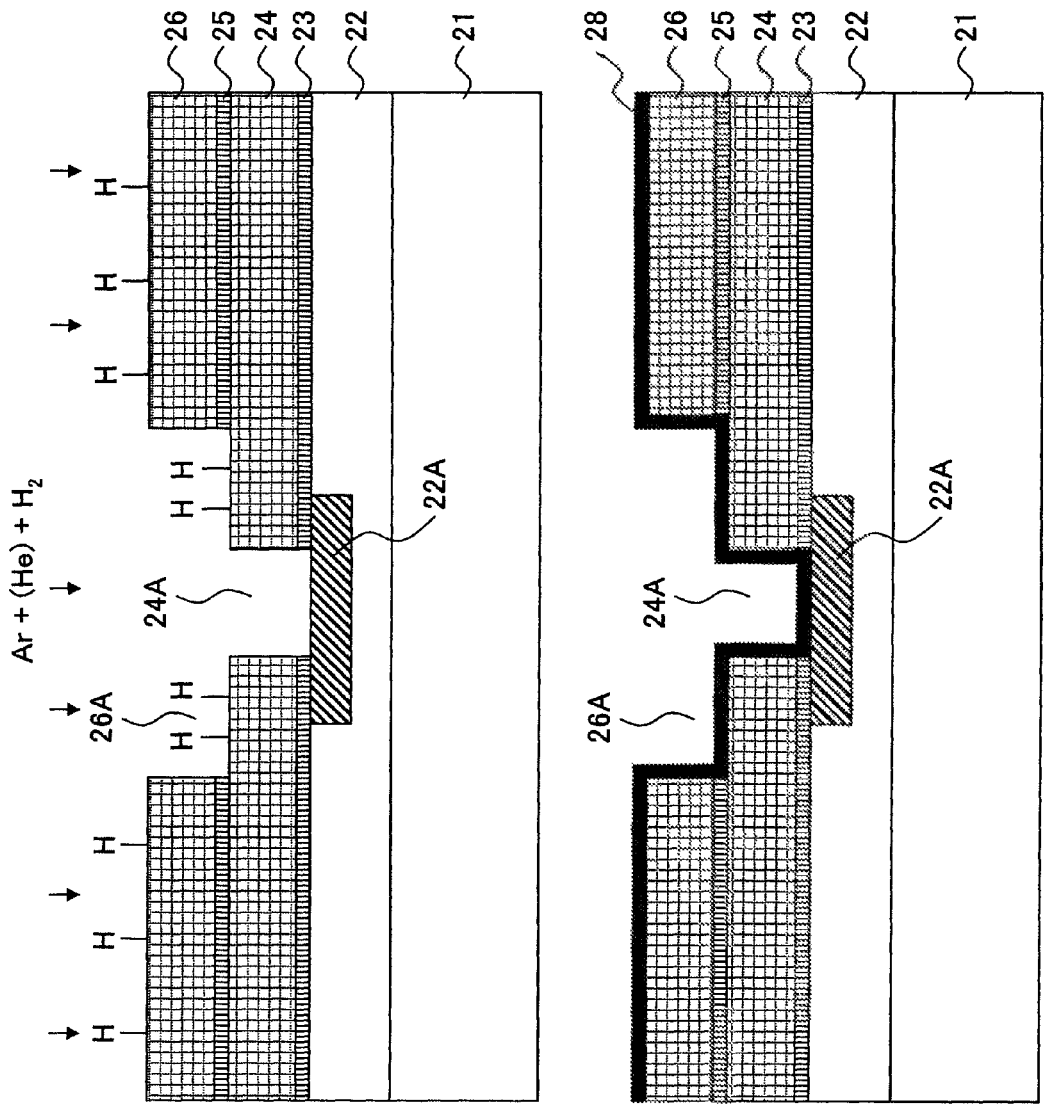

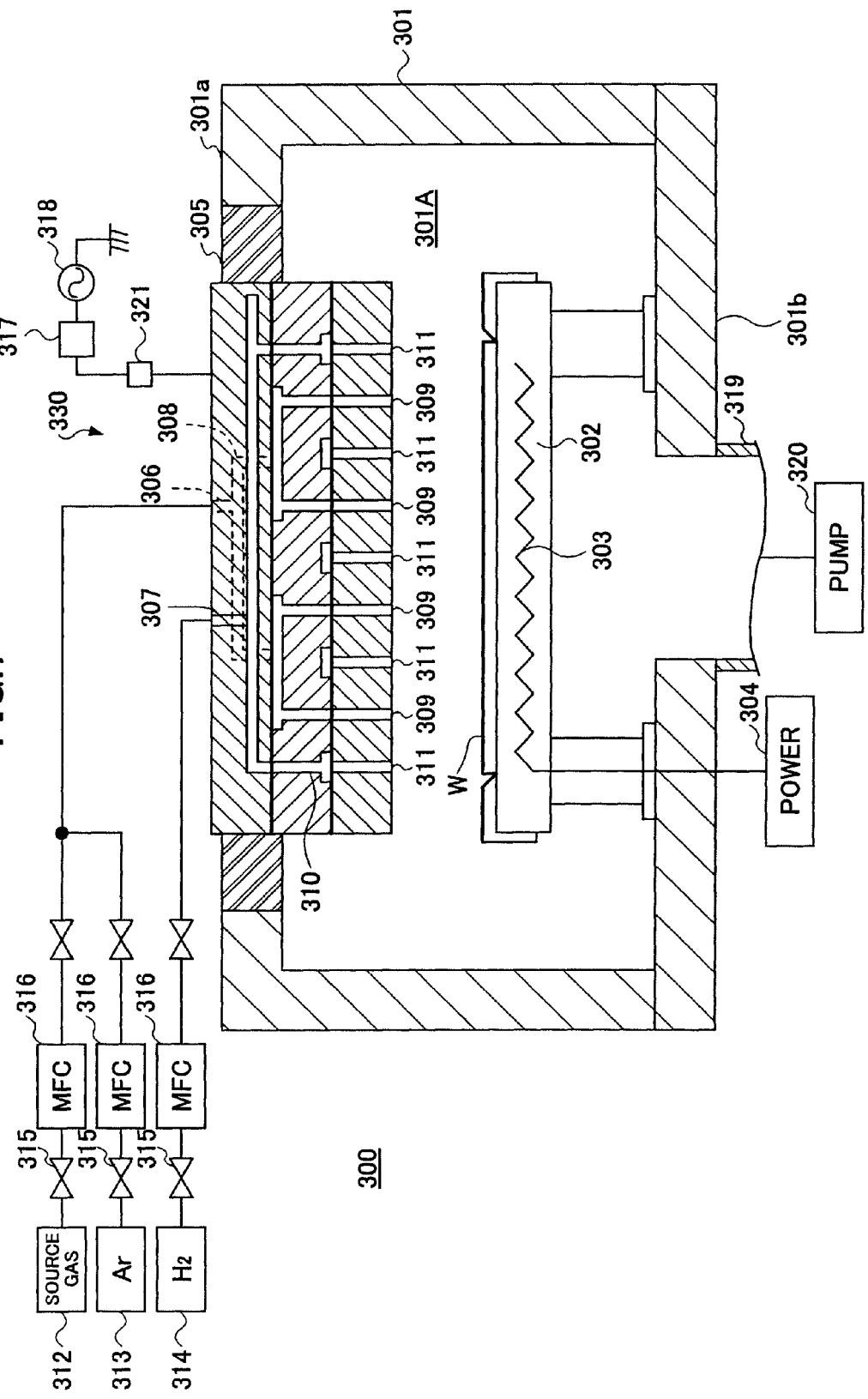

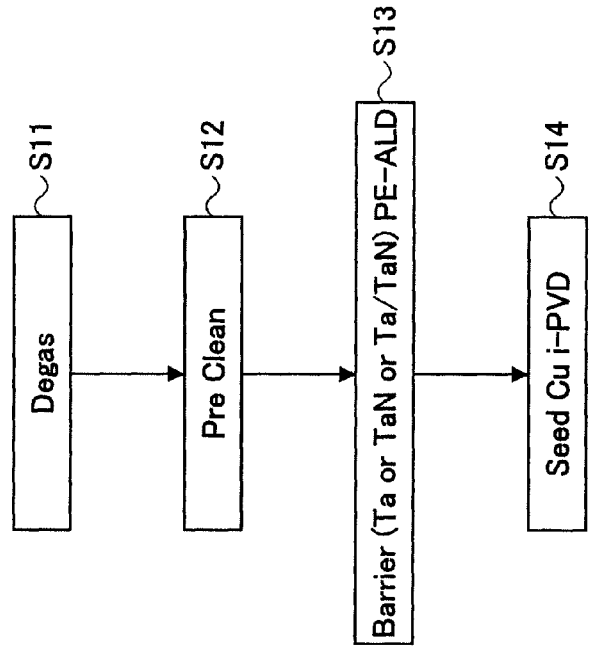
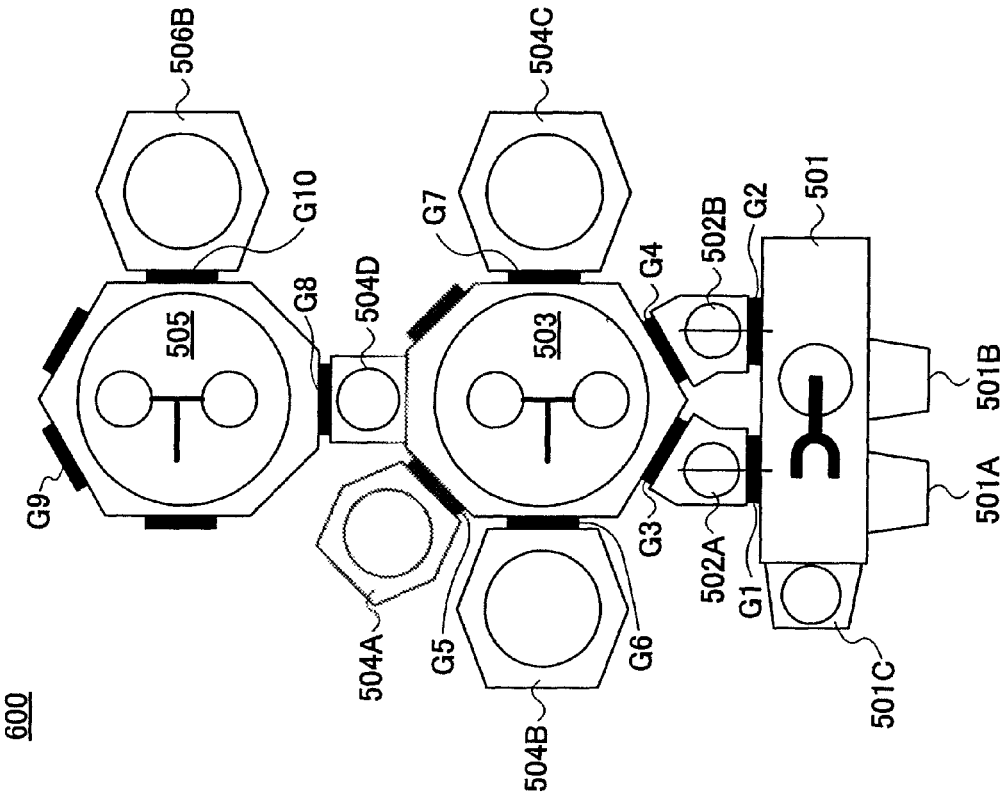

SUBSTRATE PROCESSING METHOD AND FABRICATION PROCESS OF A SEMICONDUCTOR DEVICE

BACKGROUND OF THE INVENTION

The present invention generally relates to fabrication of semiconductor devices and more particularly to a substrate processing method and fabrication process of a semiconductor device.

In recent semiconductor integrated circuit devices, it is generally practiced to use a multilayer interconnection structure, in which a number of interconnection layers each burying an interconnection pattern in an interlayer insulation film are stacked, for interconnecting large number of device elements formed on a substrate.

With such a multilayer interconnection structure, the technology of damascene process or dual damascene process is used extensively, in which a depression is formed in advance in a low-K dielectric interlayer insulation film in the form of a desired interconnection pattern or desired via-plug pattern, followed by filling the depression with a low-resistance metal layer such as a Cu layer via a barrier metal layer, and further removing excessive metal layer from the surface of the interlayer insulation film by a CMP (chemical mechanical polishing) process.

With such a multilayer interconnection structure, it is essential to use a low-K dielectric film for the interlayer insulation film in combination low-resistance metal layer such as a Cu layer for reducing the signal delay caused by stray capacitance formed between adjacent interconnection patterns and further for reducing the power consumption, in view of increasing effect of the stray capacitance in modern, highly miniaturized semiconductor devices characterized by large integration density.

Thus, a low-K dielectric material, such as an SiOC (carbon-doped silicon oxide film) film, are used for the interlayer insulation film are used with recent, advanced semiconductor integrated circuit devices. It should be noted that conventionally used low-K dielectric material could provide the value of only 2.4-2.5 for the minimum specific dielectric constant.

REFERENCES (Patent Reference 1) Japanese Laid-Open Patent Application 2003-77976
(Patent Reference 2) Japanese Laid-Open Patent Application 2000-58536
(Patent Reference 3) Japanese Laid-Open Patent Application 2002-370059
(Patent Reference 4) U.S. Pat. No. 6,638,859

SUMMARY OF THE INVENTION

FIGS. 1A-1D are diagrams showing the formation process of an interconnection layer according to a typical conventional dual damascene process.

Referring to FIG. 1A, an interconnection pattern 111A of low-resistance metal such as Cu is embedded in an $SiO_2$ film 111 formed on a silicon substrate 110, and a low-K dielectric interlayer insulation film 113 is formed on the $SiO_2$ film 111 in the step of FIG. 1B via an etching stopper film 112. Similarly, a low-K dielectric interlayer insulation film 115 is formed on the low-K dielectric interlayer insulation film 113 via an etching stopper film 114.

Next, in the step of FIG. 1C, there are formed depressions 113A and 113B respectively in the interlayer insulation films 113 and 115 for the interconnection trench and the via-hole, while using the SiN film 114 as an etching stopper film, such that the Cu interconnection pattern 111A is exposed at the bottom of the via-hole 113B. Further, a barrier metal film 116 is formed on the structure of FIG. 1B in the step of FIG. 1C such that the barrier metal film 116 covers the bottom surface and further the sidewall surface of the depressions 113A and 113B.

Further, in the step of FIG. 1D, the depressions 113A and 113B are filled with a Cu film not illustrated, and excess Cu film on the interlayer insulation film 115 and the barrier metal film 116 on the top surface of the interlayer insulation film are polished out by a CMP process. With this, the depressions 113A and 113B are filled with Cu, and thus, a structure shown in FIG. 1D is obtained in which the conductive pattern 117, which may be a Cu interconnection pattern or a conductive plug, is embedded in the interlayer insulation films 113 and 115.

With such a conventional process of formation of the multilayer interconnection structure, formation of the via-hole 113B is conducted by a dry etching process of the interlayer insulation film 113, while there arise various problems associated with such a dry etching process.

FIGS. 2A and 2B are diagrams showing the process corresponding to the step of FIG. 1C for the part conducted after the step of formation of the via-hole 113B up to the step of formation of the barrier metal film 116. It should be noted that FIGS. 2A and 2B show the region of the via-hole 113B of the structure of FIG. 1C with increased magnification.

Referring to FIG. 2A, when the via-hole 113B is formed in the interlayer insulation film 113 by a dry etching process, there can occur a case in which the sidewall surface of the via-hole 113B or the surface of the interlayer insulation film 113 is terminated by an etching reside such as methyl group contained in the low-K dielectric interlayer insulation film.

Further, in the case the substrate formed with the via-hole 113B shown in FIG. 2A is held in the atmospheric ambient, there arise problems such as water or organic substance in the air causing adsorption upon the surface of the interlayer insulation film 113, the surface of the via-hole 113B, or on the sidewall surface of the interconnection trench, although illustration is omitted. Thereby, the Cu interconnection pattern 111A may undergo oxidation by oxygen in the air at the bottom part of the via-hole 113B and there may be formed an oxide layer 111Ox on the surface of the Cu interconnection pattern 111A.

Here, it should be noted that most of the water or organic substance thus adsorbed can be removed by conducting a degassing process in an inert gas, while the oxide layer 111Ox cannot be removed with such a degassing process. Further, complete removal of the methyl group terminating the surface of the interlayer insulation film 113 is difficult.

Thus, when the barrier metal film 116 is formed on such a structure in the step of FIG. 2B by simply conducting a sputtering process, CVD process or ALD process, there occurs a nucleation process at the site where the impurities such as the methyl group are remaining on the surface of the interlayer insulation film 113 or the sidewall surface of the via-hole 113B, and the barrier metal film 116 becomes a discontinuous film or defective film including a large amount of defects 116A, through which the surface of the interlayer insulation film 113 is exposed.

Thus, when the via-hole 113B is filled with a Cu interconnection material, the Cu atoms can cause diffusion into the interlayer insulation film 113 via the defects 116A existing in the barrier metal film 116, and various problems such as increase of specific dielectric constant or leakage current would be caused. Further, because the interconnection pattern 111 is formed with the oxide layer 111Ox at the bottom of the via-hole 113B as noted before, there may be caused the problems such as poor adhesion to the underlying Cu interconnection pattern 111A or increase of contact resistance to the Cu interconnection pattern 111A at the via-hole 113B.

On the other hand, there is a known preprocessing technology of cleaning, conducted after the step of FIG. 2A but before the deposition of the barrier metal film 116, the surface of the interlayer insulation film 113 and the sidewall surface of the via-hole 113B, and further the surface of the Cu interconnection pattern 111A exposed by the via-hole 113B, by Ar plasma such that the impurities such as the methyl group are removed from the surface of the interlayer insulation film 113 and from the sidewall surface of the via-hole 113B and such that the oxide layer 111Ox exposed at the bottom of the via-hole 113B is removed at the same time by sputter etching process.

However, such a conventional art has a drawback in that, while the impurities adhered upon the sidewall surface of the via-hole 113B at the time of formation of the interconnection trench may be removed successfully, the sputter etching of the oxide layer 111Ox may cause re-deposition of the sputter-etched Cu oxide 111x on the sidewall surface of the via-hole 113B as represented in FIG. 3.

When this occurs, the adhered copper oxide 111x makes a direct contact with the sidewall surface of the via-hole 113B, and thus, it is not possible to block the diffusion of the Cu atoms from the copper oxide 111x into the interlayer insulation film 113 even when the barrier metal film 116 is formed thereafter.

Further, with such conventional preprocessing, the low-K dielectric interlayer insulation film undergoes modification with the plasma energy, and there arises a problem that the specific dielectric constant of the interlayer insulation film is increased in the via-contact part, which is critical for high-speed operation of the semiconductor device. For example, in the case the interlayer insulation film is a low-density film that contains a functional group such as methyl group, not only the groups adhered to the via-hole sidewall surface as impurity but also the groups constituting the interlayer insulation film are removed as a result of the plasma processing, and the density of the interlayer insulation film, and hence the specific dielectric constant, of the interlayer insulation film is increased locally in the vicinity of the via contact.

Thus, it is a general object of the present invention to provide a novel and useful substrate processing method and fabrication method of a semiconductor device wherein the foregoing problems are eliminated.

Another and more specific object of the present invention is to provide a substrate processing method and fabrication method of a semiconductor device capable of exposing, at the time of formation of a via-hole in an interlayer insulation film by a dry etching process, an active surface at the sidewall surface of the via-hole by removing impurities adsorbed thereto, without causing sputtering in an interconnection pattern exposed at the bottom of the via-hole, and further capable of converting a metal oxide film formed at the foregoing exposed part of the interconnection pattern at the bottom of the via-hole into a metal film.

The present invention achieves the foregoing object of the present invention by a method of fabricating a semiconductor device, comprising the steps of:

forming a via-hole in an interlayer insulation film such that a metal interconnection pattern formed underneath the interlayer insulation film is exposed at a bottom of said via-hole;

forming a conductive barrier film on the interlayer insulation film so as to cover a sidewall surface of the via-hole and the exposed metal interconnection pattern in conformity with a shape of said via-hole; and forming a metal film on said conductive barrier film, wherein there is provided a preprocessing step, after the step of forming the via-hole but before the step of forming the conductive barrier film, of processing the interlayer insulation film including the sidewall surface of the via-hole and a bottom surface of the via-hole, with plasma containing hydrogen having energy not causing sputtering of the metal interconnection pattern, such that a surface of the interlayer insulation film is terminated with hydrogen including the sidewall surface of the via-hole and the bottom surface of the via-hole.

Another object of the present invention is to provide a substrate processing method, comprising the steps of:

forming a via-hole in an insulation film so as to expose a metal pattern formed underneath the insulation film at a bottom of the via-hole; and forming a conductive barrier film on the insulation film in conformity with a shape of the via-hole such that the conductive barrier film covers a sidewall surface of the via-hole and the metal pattern exposed at the bottom of the via-hole, wherein there is provided a preprocessing step, after the step of forming said via-hole but before said step of forming the conductive barrier film, of processing the interlayer insulation film including the sidewall surface of the via-hole and a bottom surface of the via-hole, with plasma containing hydrogen having energy not causing sputtering of the metal pattern, such that a surface of the interlayer insulation film is terminated with hydrogen including the sidewall surface of the via-hole and the bottom surface of the via-hole.

According to the present invention, it becomes possible, at the time of forming a via-hole in an interlayer insulation film so as to expose a metal interconnection pattern and further forming a conductive barrier film on the interlayer insulation film so as to cover the sidewall surface of the via-hole and the exposed metal interconnection pattern, to remove the impurities that have adhered to the sidewall surface of the via-hole at the time of formation of the via-hole conducted by dry etching of the interlayer insulation film, by applying the foregoing preprocessing to the surface of the interlayer insulation film, the sidewall surface of the via-hole and to the metal interconnection pattern exposed at the bottom of the via-hole. Further, with the present invention, there occurs no problem of metal contamination in the sidewall surface of the via-hole in view of the fact that there occurs no sputtering of the metal interconnection pattern. Further, as a result of use of the plasma containing hydrogen for the preprocessing, any metal oxide formed at the bottom of the via-hole is reduced, and the contact resistance at the via hole is reduced. Further, because the preprocessing is conducted with the plasma containing hydrogen, the surface of the interlayer insulation film, the sidewall surface of the via-hole and further the bottom surface of the via-hole are terminated with hydrogen, and a structure not easily cause adsorption of impurities is obtained. Further, by conducting such a preprocessing with low energy plasma, it is possible with the present invention to avoid modification of the interlayer insulation film itself while successfully removing impurities adhered to the surface of the interlayer insulation film, and there arises no problem such as increase of the specific dielectric constant.

The present invention is particularly useful with the process that uses a low density insulation film called low-K film having a specific dielectric constant of 3.0 or less. Such a low density insulation film includes SiOCH films formed by CVD process, inorganic SOD films and organic polymer films, including porous films of these.

Other objects and further features of the present invention will become apparent from the following detailed description when read in conjunction with the attached drawings.

BRIEF DESCRIPTION OF THE DRAWINGS

FIGS. 6A-6I are diagrams showing the method of forming a multilayer interconnection structure according to a first embodiment of the present invention;

FIG. 7 is a diagram showing the construction of an ALD apparatus used for deposition of a barrier metal film in the first embodiment;

FIG. 11A is a diagram showing the construction of a substrate processing system according to a second embodiment of the present invention while

FIG. 12A is a diagram showing the construction of a substrate processing system according to a third embodiment of the present invention while FIG. 12B is a flowchart showing a substrate processing sequence conducted with the system of FIG. 12A;

FIG. 13A is a diagram showing the construction of a substrate processing system according to a fourth embodiment of the present invention while

DETAILED DESCRIPTION OF THE PREFERRED EMBODIMENTS

First Embodiment

First, the principle of the present invention will be explained with reference to a first embodiment.

Figure 4:
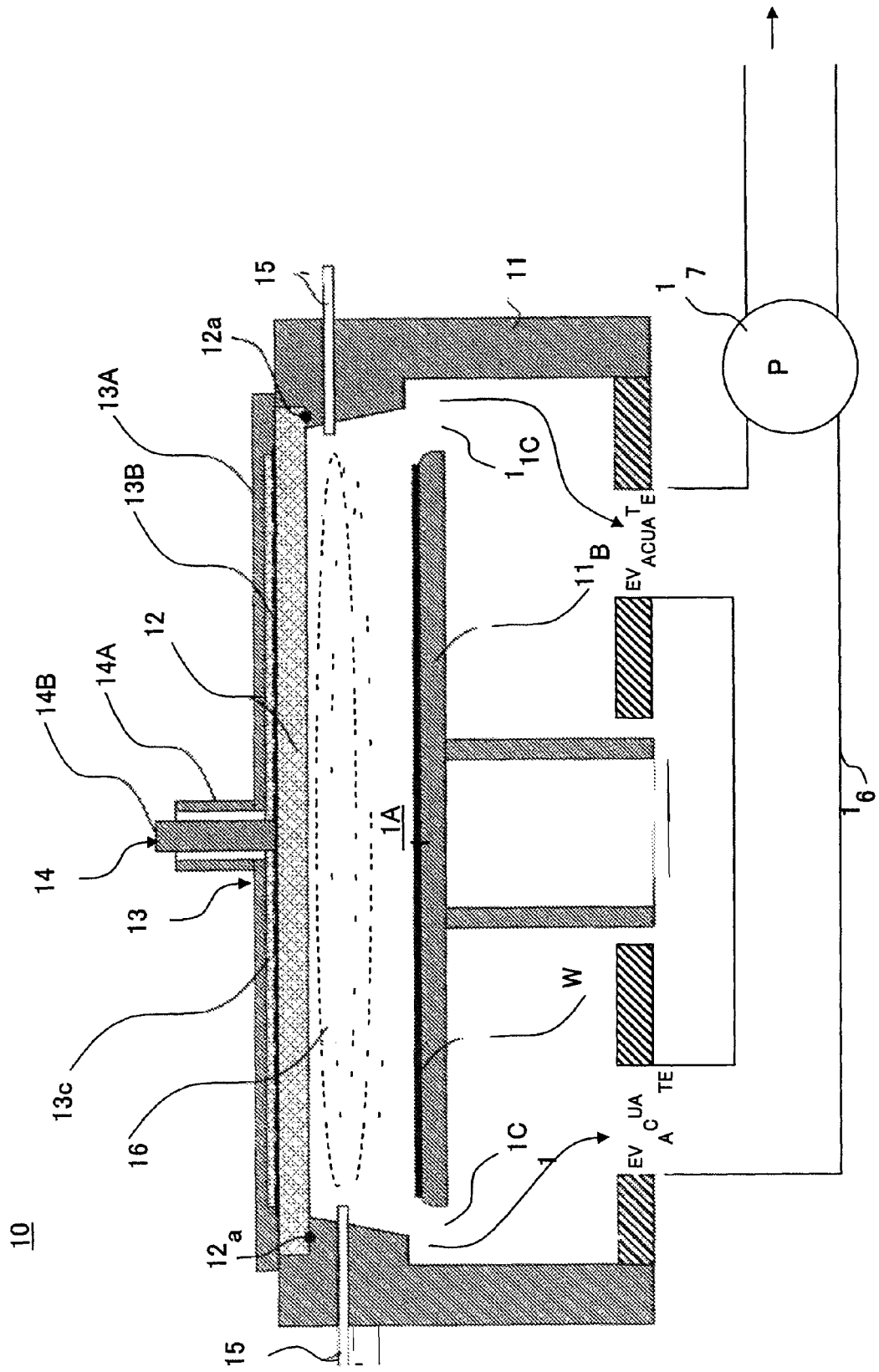
FIG. 4 is a diagram showing the construction of a plasma processing apparatus used with the present invention.
Figure 5:
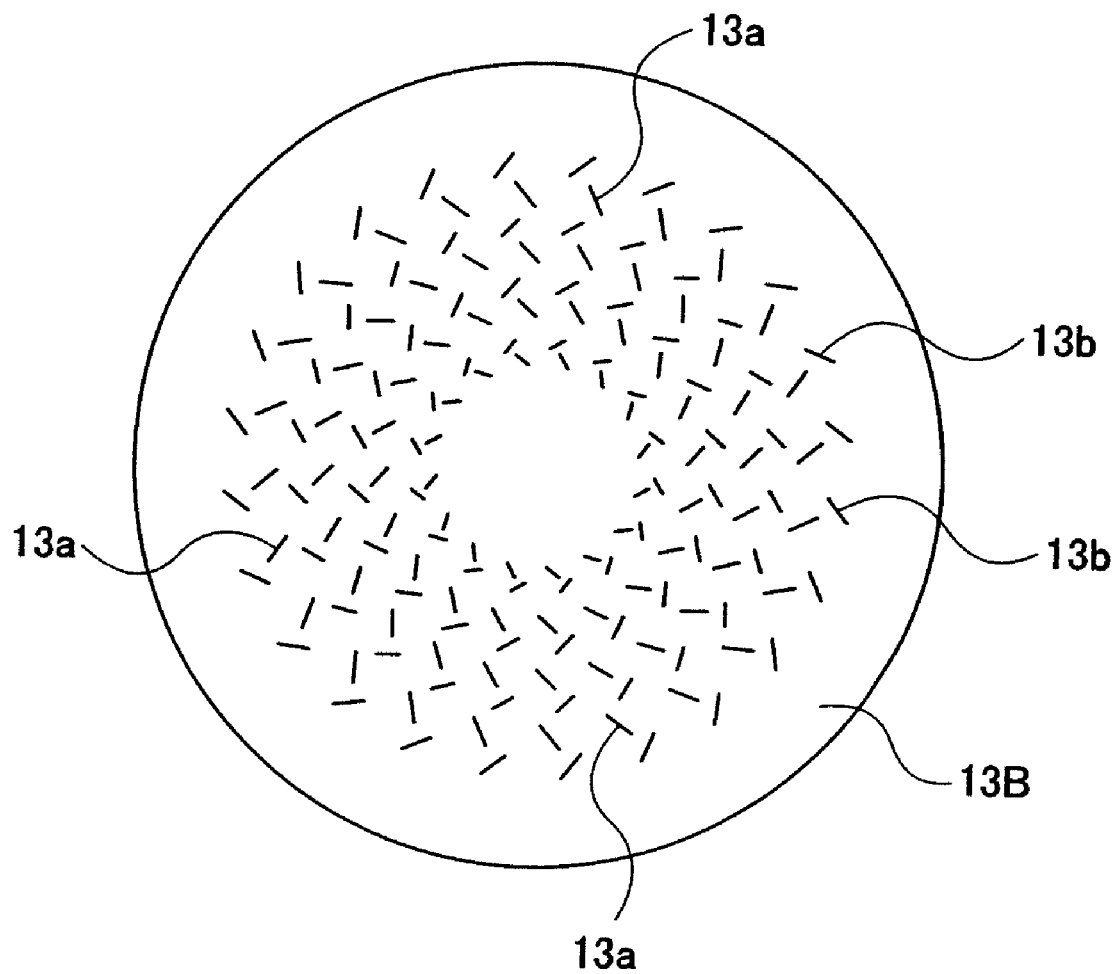
FIG. 5 is another diagram showing the construction of a plasma processing apparatus used with the present invention.

FIGS. 4 and 5 are diagrams showing the construction of a plasma processing apparatus 10 used with the present invention.

Referring to FIG. 4, the plasma processing apparatus 10 includes a processing vessel 11 accommodating therein a stage 11B used for holding a substrate W to be processed wherein the processing vessel 11 defines a processing space 11A therein together with the stage 11B. Further, a ring-shaped evacuation port 11C is formed at the outer periphery of the stage 11B such that the evacuation port 11C extends between the stage 11B and the inner wall surface of the processing vessel 11.

The processing vessel 11 is coupled with a pump 17 via a duct 16, and the reaction gas formed in the processing space 11A is evacuated to outside of the system by the pump 17 from the evacuation port 11c via a duct 16 after conducting a scribing process. A dry pump or a turbo molecular pump boosted by a dry pump may be used for the pump 17.

It should be noted that the top part of the processing space 11A is closed by a plate 12 of quartz or low-loss ceramic such as alumina held on the processing vessel 11 via a seal ring 12a, wherein an antenna 13, formed of a disk-shaped conductive shielding member 13A, a radial line slot antenna 13B provided so as to cover an antenna opening of the shield member 13A and including a large number of slots 13a and 13b shown in FIG. 5, and a retardation plate 13C of a $SiO_2$ or $Al_2O_3$ film formed between the shielding member 13A and the radial line slot antenna 13B for compressing the wavelength of microwave supplied to the antenna 13, is coupled to the plate 12.

As shown in FIG. 5, the slots 13a and 13b are arranged concentrically with a relationship so as to intersect perpendicularly with each other.

Thus, when a microwave is supplied to the antenna 13 via a coaxial waveguide 14 formed of an outer waveguide 14A connected to the shielding member 13A and an inner waveguide 14B connected to the radial line slot antenna 13B, the supplied microwave propagates between the shielding member 13A and the radial line slot antenna 13B in the radial direction and emitted from the foregoing slots 13a and 13b forming an angle of 90 degrees with each other. Thereby, the microwave emitted from the radial line slot antenna forms a circularly polarized wave having mutually perpendicular polarization planes.

Thus, by supplying a rare gas such as Ar, He, Kr, Xe, Ne, or the like, into the processing space 11A from a gas passage 15 formed in the processing vessel 11 together with a process gas such as hydrogen in this state, there is formed low-damaging high-density plasma 16 of very low electron temperature, typically 2-3 eV, in the processing space 11A with an electron density exceeding $10^{12}$ cm$^{-3}$.

Figure 1A:
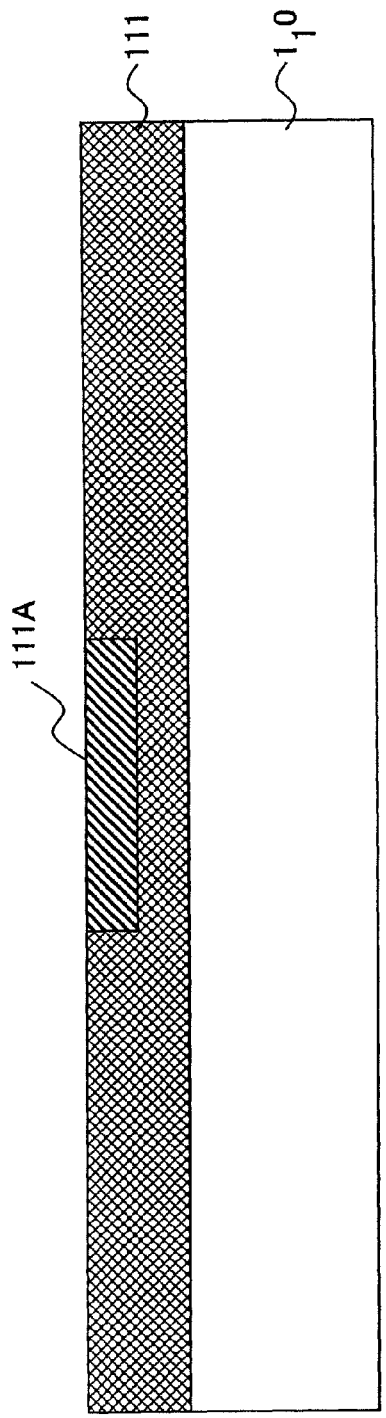
FIGS. 1A-1D are diagrams showing a conventional process of forming a multilayer interconnection structure.
Figure 1B:
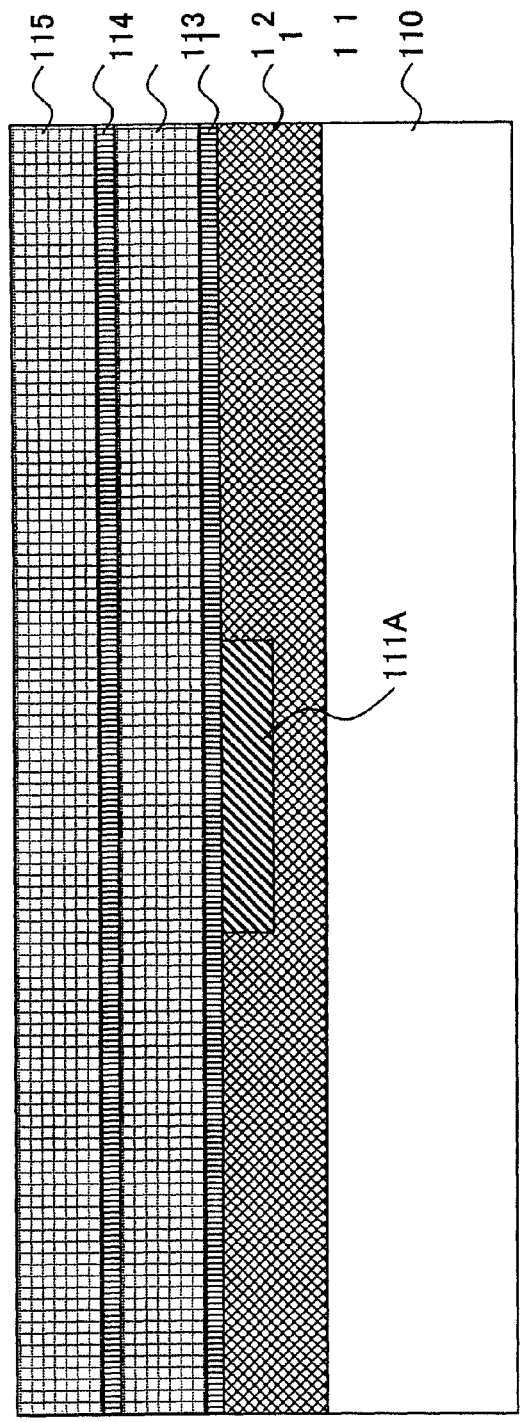
Figure 1C:
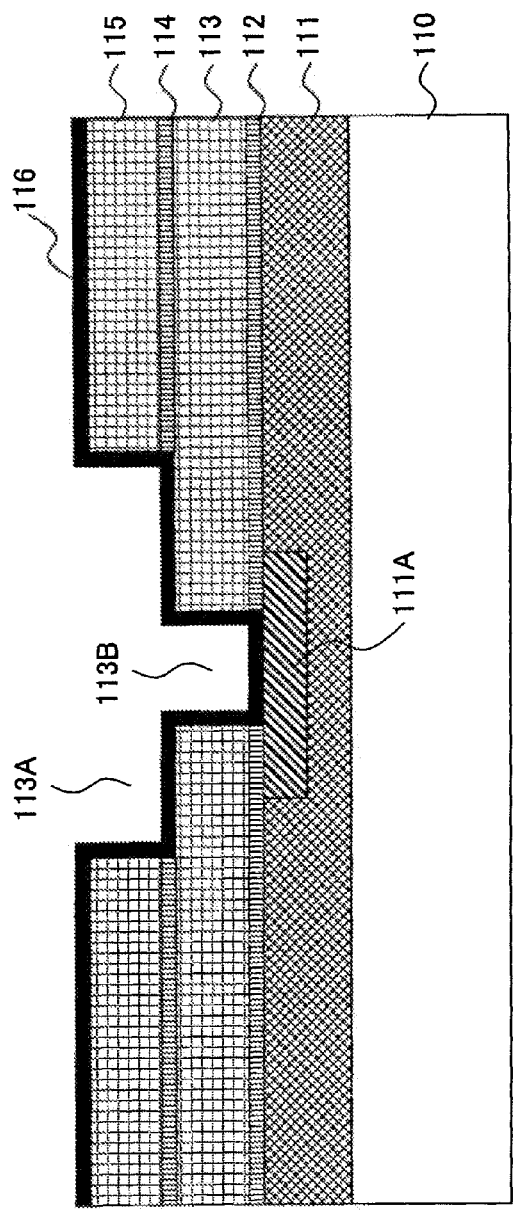
Figure 1D:
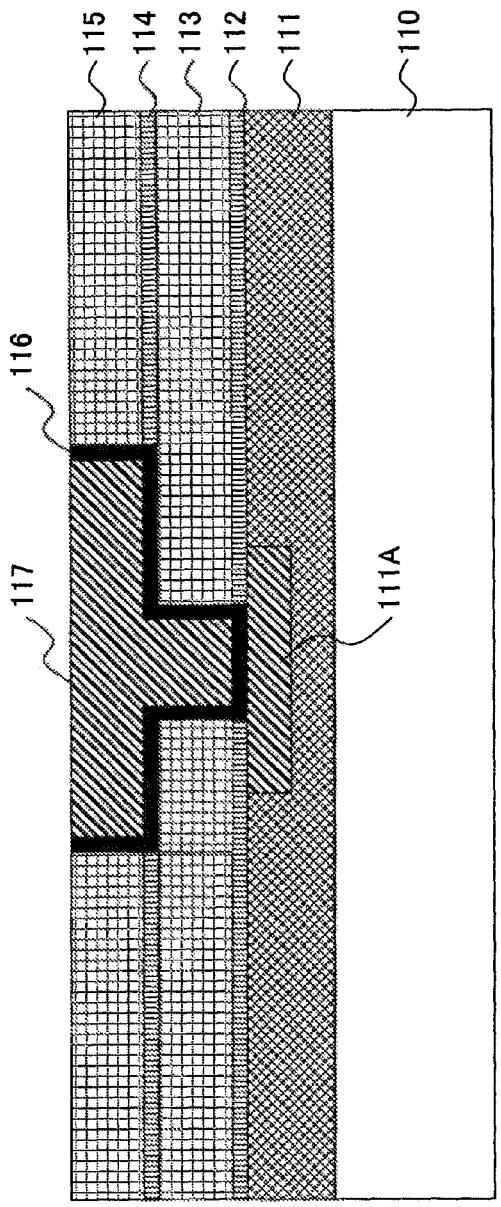
Figure 2A:
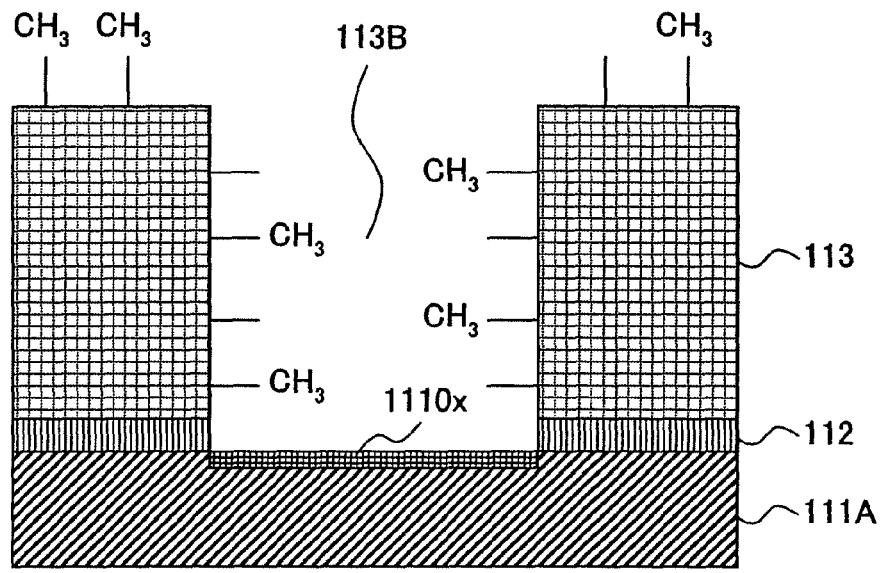
FIGS. 2A and 2B are diagrams explaining the problems addressed by the present invention.
Figure 2B:
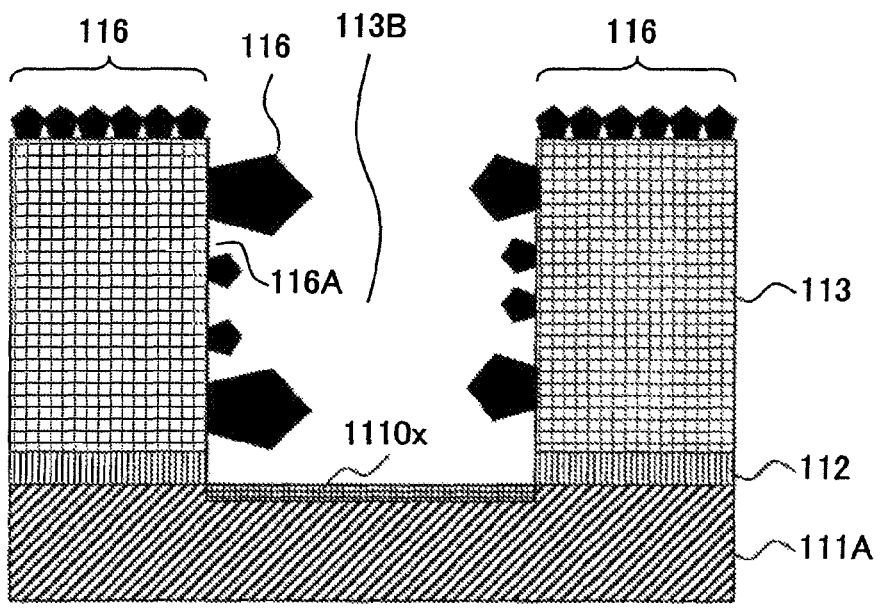
Figure 3:
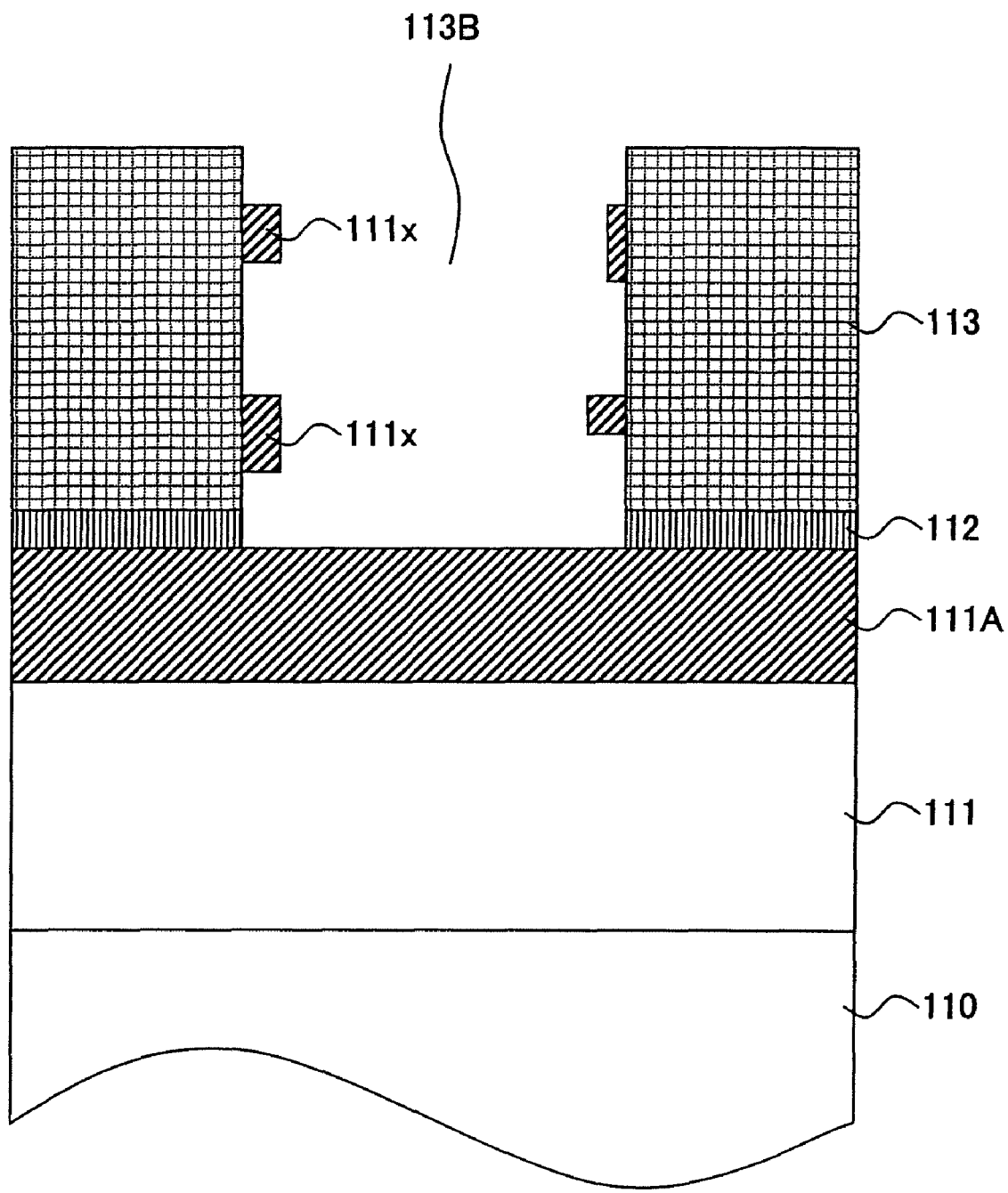
FIG. 3 is another diagram explaining the problem addressed by the present invention.

Thus, the present invention carries out the preprocessing to the structure of FIG. 2A explained before, by using such low-damage plasma.

By using such low-damage and high-density plasma formed with the microwave plasma processing apparatus 10, the impurities such as organic groups adhering to the surface of the interlayer insulation film or the sidewall surface and bottom surface of the via-hole are removed completely and there active surface is obtained. Further, because of low plasma electron temperature, there occurs no sputtering in the metal interconnection pattern exposed at the bottom of the via-hole, and thus, there occurs no problem that the sputtered metal from the metal interconnection pattern adheres to the surface of the interlayer insulation film or the sidewall surface of the via-hole before formation of the barrier metal film.

Further, by adding hydrogen to the rare gas at the time of plasma formation, the oxide exposed at the bottom of the via-hole is reduced by $H_2$, and it becomes possible to convert metal oxide at the bottom of the via-hole to metal. Thereby, a low-resistant via-contact is obtained. Further, the surface of the interlayer insulation film and the sidewall surface and the bottom surface of the via-hole are terminated with hydrogen, and a stable structure is obtained in which the tendency of adherence of impurities to the surface of the interlayer insulation film or the sidewall surface and bottom surface of the via-hole is reduced.

Hereinafter, the method of forming a multilayer interconnection structure according to the first embodiment of the present invention will be described with reference to FIGS. 6A-6I.

Figure 6A:
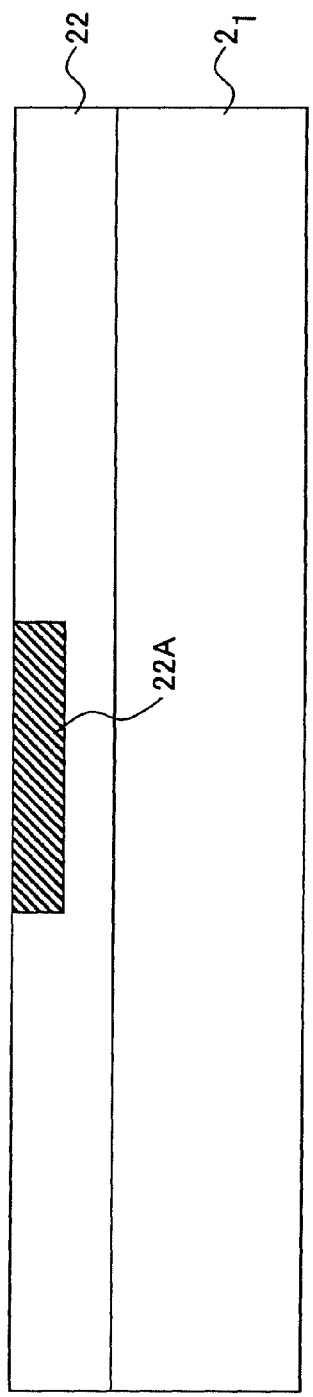

Referring to FIG. 6A, an $SiO_2$ film 22 is formed on a silicon substrate 21 with a thickness of 200 nm, and a Cu pattern 22A having a width of 0.1 μm and thickness of 100 nm is embedded in the $SiO_2$ film 22 by a damascene process, such that the Cu pattern 22A is exposed at the surface of the $SiO_2$ film 22.

Figure 6B:
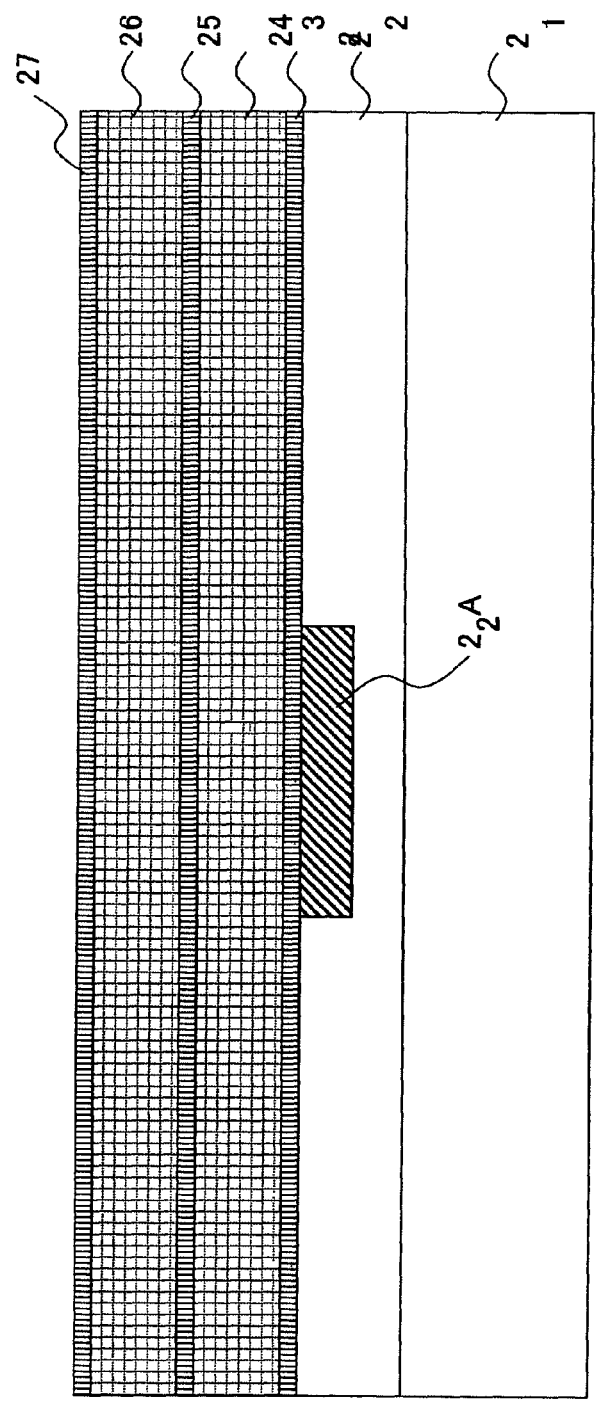

Further, in the step of FIG. 6B, an etching stopper film 23 of SiN functioning also as a barrier film 23 is formed on the structure of FIG. 6A by a plasma CVD process, and an SiCOH interlayer insulation film 24 is formed further thereon also by a plasma CVD process. Further, another SiN etching stopper film 25 and another SiCOH interlayer insulation film 26 are formed consecutively on the SiCOH interlayer insulation film 24 by a plasma CVD process, and a further SiN etching stopper film 27 is formed on the SiCOH interlayer insulation film 26 by a plasma CVD process.

For the SiOCH films 24 and 26, it is possible to use commercially available plasma CVD film. For example, in the case such SiOCH films 24 and 26 are formed by using a parallel-plate RF plasma CVD apparatus, the film formation can be conducted under the pressure of about 399 Pa (3 Torr) at the substrate temperature of 25° C. while supplying an Ar gas and a hydrogen gas with respective flow rates of 50 SCCN and 500 SCCM and feeding an RF energy of 13.50 MHz in frequency at the power of 1000 W. The SiOCH films 24 and 26 thus formed have a specific dielectric constant of about 3.0. Further, the porous film of such an SiOCH film has a specific dielectric constant of about 2.2.

Next, in the step of FIG. 6C, the SiN film 27 is patterned by a photolithographic patterning process not illustrated in conformity with a desired interconnection pattern, and the interlayer insulation film 26 is patterned by a dry etching process while using the SiN film 27 as a hard mask, until the SiN film 25 is exposed. Thereby, there is formed a groove 26A corresponding to the desired interconnection pattern in the interlayer insulation film 26.

Further, in the step of FIG. 6C, the SiN film 25 exposed by the groove 26A is patterned to form an opening corresponding to a desired via contact pattern, and the interlayer insulation film 24 is subjected to a dry etching process while using the SiN film 25 and the SiN film 27 as a hard mask until the SiN film 23 is exposed. Thereby, there is formed an opening 24A corresponding to the via-contact in the interlayer insulation film 24. Here, it should be noted that the order of the step for forming the groove 26A and the step for forming the opening 24A may be reversed in the step of FIG. 6C.

Next, in the step of FIG. 6D, the SiN film 23 exposed at the bottom of the opening 24A is removed by an etchback process such that the Cu interconnection pattern 22A is exposed at the bottom of the opening 24A. Further, as a result of the etchback process of the SiN film 23, the SiN film 27 on the interlayer insulation film 26 is removed, and the SiN film 25 at the bottom of the interconnection trench 26A is removed.

With the structure thus obtained, it should be noted that a part of the film removed by the dry etching of the interconnection trench 26A or via-hole 24A causes adhesion or adsorption to the sidewall surface and bottom surface of the interconnection trench 26A and the via-hole 24A in the form of methyl group, and thus, there occurs serious degradation in the quality of the barrier metal film when the barrier metal film is deposited directly to such a structure. Further, in the case the structure thus obtained is held in the atmospheric ambient, not only water or organic substance in the air is adsorbed to the surface of the interlayer insulation films 26 and 24, but also there is caused formation of oxide film 22a in the part of the Cu interconnection pattern 22A exposed to the air at the via-hoe 24A.

Thus, in the present embodiment, the structure thus obtained is first subjected to a degassing process for removing the water or organic substance adsorbed in the air and then introduced into the plasma processing apparatus 10 of FIGS. 4 and 5 in the step of FIG. 6E. Thereby, a preprocessing is conducted for removing impurities such as organic groups from the surface of the interlayer insulation films 24 and 26, and the sidewall surface and bottom surface of the interconnection trench 26A and the via hole 24A.

More specifically, the preprocessing is conducted with the apparatus of FIGS. 4 and 5 under the pressure of 13.3-1330 Pa (0.10-10 Torr) at the substrate temperature of 50-250° C., preferably 200° C. or less, by supplying an Ar gas or He gas and a hydrogen gas with the flow rate of 100-1000 SCCM for each, while supplying a microwave of the frequency of 2.45 GHz from the radial line slot antenna 13B with the power of 1000-5000 W.

With this, the impurities such as methyl group adhered to the surface of the interlayer insulation film 26, the sidewall surface and bottom surface of the interconnection trench 26A and the sidewall surface and bottom surface of the via-hole 24 are successfully removed.

Because the plasma contains hydrogen, there occurs reduction of the metal oxide film 22a, and thus, a clean metal surface of the Cu pattern 22A is exposed at the bottom of the via-hole 24A. Further, the surface of the interlayer insulation film 26, the sidewall surface and bottom surface of the interconnection trench 26A and the sidewall surface and bottom surface of the via-hole 24A are terminated by hydrogen in the plasma.

Next, in the step of FIG. 6F, the structure of FIG. 6E is introduced to a film forming apparatus 300 shown in FIG. 7, and a barrier metal film 28 is formed in the form of lamination of a TaN film, a conductive nitride film, and a Ta film, a refractory metal film, by a so-called ALD process in which a film-forming gas and a reducing gas are supplied alternately with intervening purge step.

Referring to FIG. 7, the film-forming apparatus 300 has a processing vessel 301 defining a processing space 301A evacuated by a pump 320 via an exhaust line 319, and a susceptor 302 holding thereon a substrate W to be processed is accommodated in the processing space 301A. The susceptor 302 is embedded with a heater 303, and the substrate W is heated to a predetermined temperature by driving the heater 303 by a driving power source 304. Further, there is provided a shower head 330 at a top part 301a of the processing vessel 301 via an insulating member 305 such that the shower head 330 faces the substrate W on the susceptor 302.

On the top surface of the shower head 330, there is formed a gas inlet 306 for introducing a source gas and a gas inlet 307 for introducing a reducing gas such as $H_2$, wherein the gas inlet 306 is connected to a large number of source gas passages 308 formed in the interior of the shower head 330, and each of the source gas passages 308 is connected to a corresponding gas outlet hole 309 via an intervening gas dispersion chamber.

On the other hand, the inlet opening 307 is connected to a large number of reducing gas passage 310 in the shower head 330, while each of the reducing gas passages 310 is connected to a corresponding reducing gas outlet hole 311 via a gas dispersion chamber. With such a so-called post-mix shower head 330, there occurs no mixing of source gas and reducing gas inside the shower head 330, and thus, there occurs no film formation inside the shower head 330 as a result of reduction of the source gas.

To the gas inlet port 306, a gas source 312 for the source gas and a gas source 313 for an inert carrier gas such as Ar are connected via a valve 315 and a mass flow controller 316, wherein the source gas from the gas source 312 is transported to the processing space inside the processing vessel 301 by the carrier gas from the gas source 313 via the shower head 330. Further, a gas source 314 of a reducing gas is connected to the gas inlet port 307 via a valve 315 and a mass flow controller 316, wherein the hydrogen gas from the gas source 314 is supplied to the processing vessel 301. Further, while not illustrated, the plasma CVD apparatus 300 is provided with a line for supplying another inert gas, which may be an Ar gas or nitrogen gas, into the processing vessel 301 for the purpose of purging.

Further, a high-frequency source 318 is connected to the shower head 330 via an impedance matcher 317 and a frequency matcher 321, and there is caused plasma excitation of the gas supplied to the processing vessel 301 by supplying the high-frequency power from the power source 318 to the shower head 330 via the matcher 321. With this, a film forming reaction proceeds in the processing vessel 301.

Figure 8:
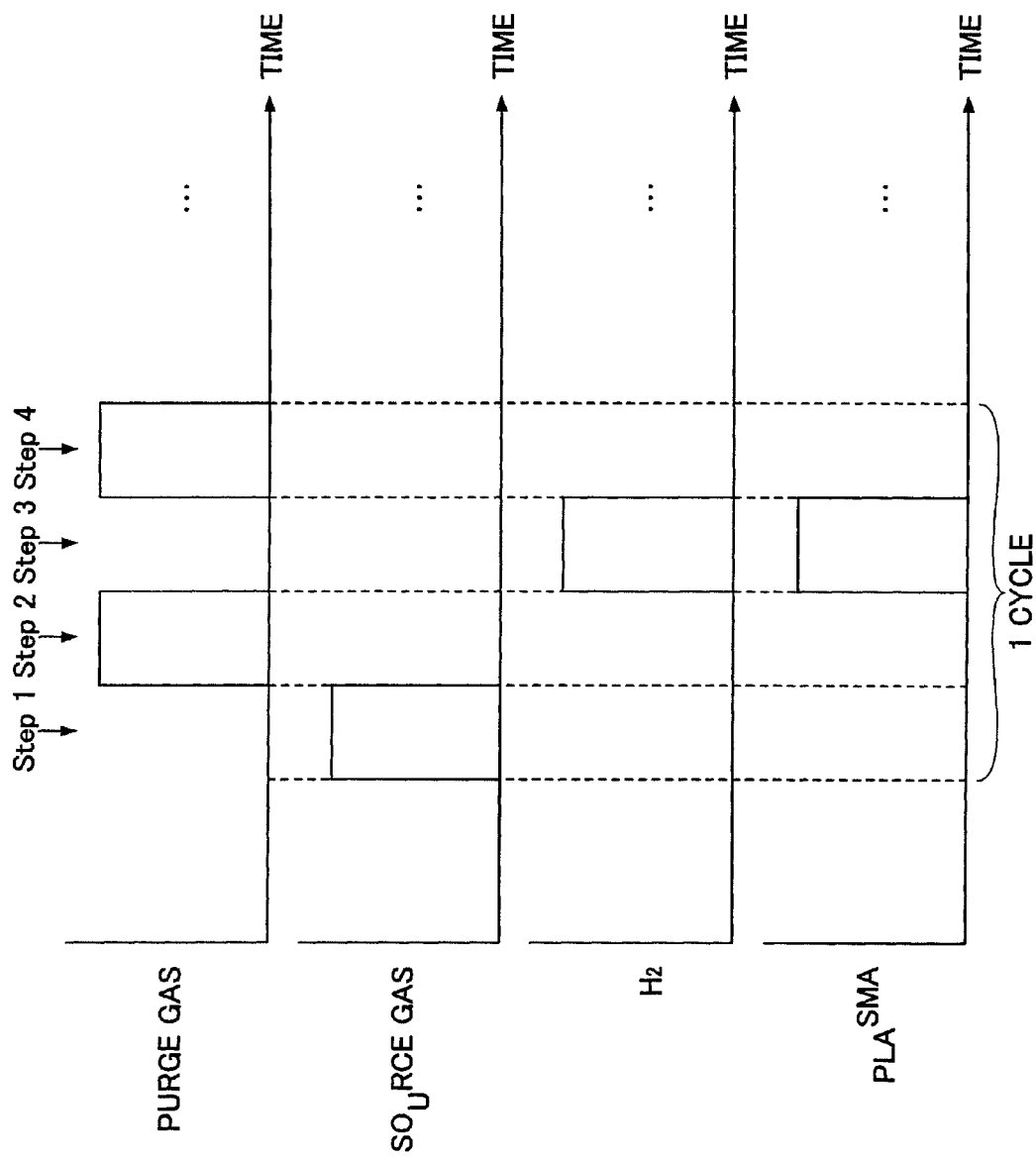
FIG. 8 is a diagram showing the deposition sequence of a barrier metal film by the ALD apparatus of FIG. 7.

FIG. 8 shows an example of the ALD process conducted by using the film forming apparatus 300 of FIG. 7.

Referring to FIG. 8, the source gas from the source 312 is introduced into the processing space 301A inside the processing vessel 321 in the step 1 by the Ar carrier gas from he Ar gas source 313. Thereby, the source molecules in the source gas thus introduced cause chemical absorption upon the surface of the substrate W to be processed, and there is formed a very thin layer of source molecules on the surface of the substrate W with the thickness of 1—several molecular layers.

Next, in the step 2, the source gas remaining in the processing space 301A is purged by introducing the Ar purge gas or by way of vacuum evacuation, and in the step 3, the hydrogen gas in the gas source 314 is introduced into the processing space 301A.

At the same time, the plasma source 318 is energized in the step 3, and with this, there are formed hydrogen radicals or hydrogen ions in the processing space 301A as a result of excitation of the hydrogen gas. The hydrogen radicals and the hydrogen ions thus formed act upon the source molecules adsorbed upon the surface of the substrate W and cause reduction. Thereby, there is formed a film with the thickness of 1—several atomic layers.

Further, in the step 4, the hydrogen gas remaining in the processing space 301A is purged by again introducing the Ar purge gas or by carrying out the vacuum evacuation processing.

As explained previously, the present embodiment forms the barrier metal film 28 in the form of lamination of a TaN film and a Ta film, wherein the ALD process of FIG. 8 is applicable to any of formation of the TaN film and the TaN film. In this case, it is preferable to form the TaN film and the Ta film consecutively from the side of Cu in view of intimate contact to the Cu layer.

In the case of forming the TaN film by an ALD process, the processing space 301A inside the processing vessel 301 is maintained to the processing pressure of 0.133-133 Pa (0.001-1 Torr), and the temperature of the substrate W is set to 150-350° C., preferably about 250° C.

Further, in the step 1 of FIG. 8, $Ta(NC(CH_3)_2C_2H_5)(N(CH_3)_2)_3$ is supplied from the source 312 to a vaporizer (not illustrated) as the source of a TaN film with the flow rate of 10-100 mg/minute, and a vaporized gaseous source is supplied to the processing vessel 301 by an Ar carrier gas with the flow rate of 100-1000 SCCM. By holding the state of the step 1 for about 1 second, the molecular layer of the source molecules is formed on the surface of the substrate W.

Next, in the step 2, the processing space is purged by supplying an Ar gas and a hydrogen gas for 1 second with respective flow rates of 100-2000 SCCM and 0-2000 SCCM, and in the step 3, a hydrogen gas from the gas source 314 is supplied with a flow rate of 200-2000 SCCM.

In the step 3, the high-frequency source 318 is driven further, and the RF wave of the frequency of 13.56 MHz is supplied to the shower head 330 with the power of 100-2000 W. With this, the $Ta(NC(CH_3)_2C_2H_5)(N(CH_3)_2)_3$ molecules adsorbed upon the substrate W are decomposed, and there is formed a TaN film on the structure of FIG. 6E with the thickness of 1—several molecular layers, such that the TaN film covers the sidewall surface and bottom surface of the interconnection trench 26A and the via-hole 24A continuously.

Further, in the step 4 of FIG. 8, the processing space is purged for 1 second by supplying the Ar gas and the hydrogen gas with respective flow rates of 100-2000 SCCM and 0-2000 SCCM. Thereby, it is also possible to use only one of Ar and hydrogen for the purge gas.

Further, by repeating the steps 1-4, the TaN film is formed with a desired thickness such as 0.1-2 nm, preferably 0.1-1 nm. For the source of the TaN film, it is also possible to use a metal organic compound such as $Ta[N(C_2H_5CH_3)]_5$ (PEMAT), $Ta[N(CH_3)_2]_5$ (PDMAT), $Ta[N(C_2H_5)_2]_5$ (PDEAT), $Ta(NC(CH_3)_3)(N(C_2H_5)_2)_3$ (TBTDET), $Ta(NC(CH_3)_2)_3$, $Ta(NC_2H_5)_2)_3$, $Ta(N(C_2H_5)_2)(N(C_2H_5)_2)_3$, and the like, in addition to $Ta(NC(CH_3)_2C_2H_5)(N(CH_3)_2)_3$.

In the case of forming a Ta film on the TaN film thus formed by an ALD process, the processing space 301A of the processing vessel 301 is set to the processing pressure of 0.133-133 Pa (0.001-1 Torr), and the temperature of the substrate W is set to 150-350° C.

Further, in the step 1 of FIG. 8, $TaCl_2$ is supplied to the processing vessel 301 from the gas source 312 as the source of a TaN film with the flow rate of 1-10 SCCM together with an Ar carrier gas of the flow rate of 100-1000 SCCM. By holding the state of the step 1 for about 5 second, the molecular layer of the source molecules of $TaCl_5$ is formed on the surface of the substrate W.

Next, in the step 2, the processing space is purged by supplying an Ar gas and a hydrogen gas for 1 second with respective flow rates of 100-2000 SCCM and 0-2000 SCCM, and in the step 3, a hydrogen gas from the gas source 314 is supplied with a flow rate of 200-2000 SCCM.

In the step 3, the high-frequency source 318 is driven further, and the RF wave of the frequency of 13.56 MHz is supplied to the shower head 330 with the power of 100-2000 W. With this, the $TaCl_5$ molecules adsorbed upon the substrate W are decomposed, and there is formed a Ta film on the structure of FIG. 6E with the thickness of 1—several molecular layers, such that the Ta film covers the sidewall surface and bottom surface of the interconnection trench 26A and the via-hole 24A continuously.

Further, in the step 4 of FIG. 8, the processing space is purged for 1 second by supplying the Ar gas and the hydrogen gas with respective flow rates of 100-2000 SCCM and 0-2000 SCCM. Thereby, it is also possible to use only one of Ar and hydrogen for the purge gas.

Further, by repeating the steps 1-4, the Ta film is formed with a desired thickness such as 0.1-2 nm, preferably 0.5-1 nm. For the source of the Ta film, it is also possible to use $TaF_5$, $TaBr_5$, $TaI_5$, and the like, in addition to $TaCl_5$.

Figure 6G:
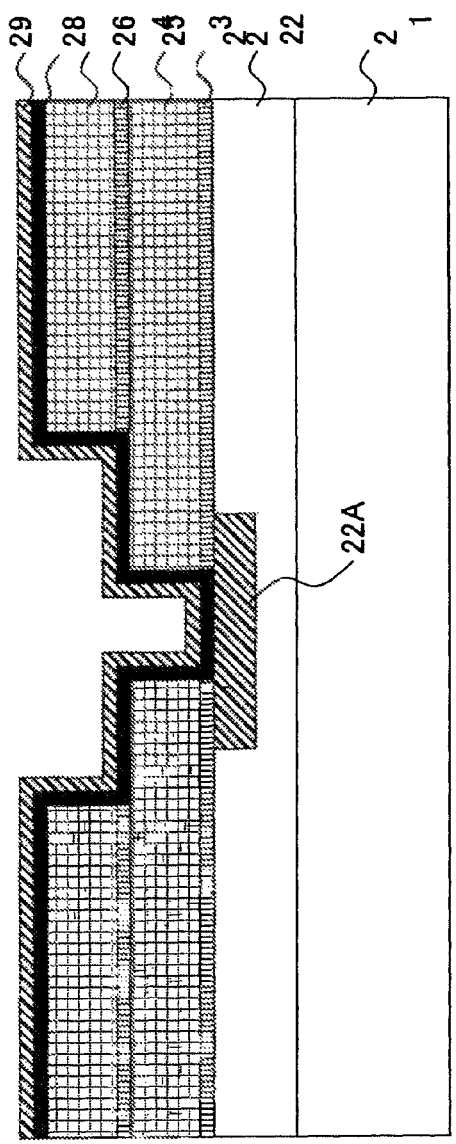

After forming the barrier metal film 28 of the TaN/Ta laminated structure in the step of FIG. 6F on the sidewall surfaces and bottom surfaces of the interconnection trench 26A and the via-hole 24A, a Cu seed layer 29 is formed in the step of FIG. 6G on the barrier metal film 28 in conformity with the shape of the interconnection trench and the via hole.

Figure 9:
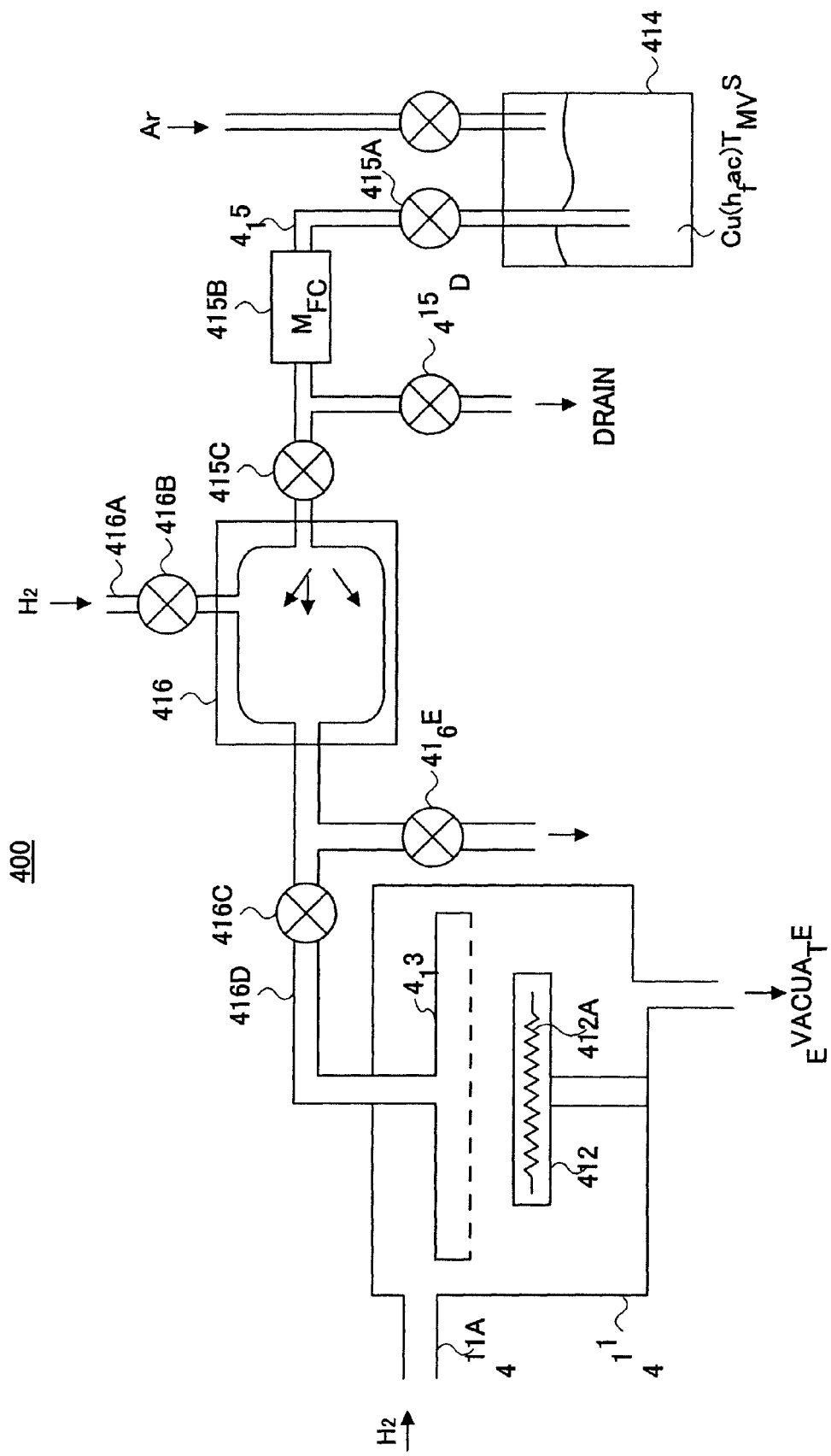
FIG. 9 is a diagram showing the construction of a CVD apparatus used for deposition of a Cu seed layer.

FIG. 9 shows the construction of a CVD apparatus 400 used for the formation of the Cu seed layer 29.

Referring to FIG. 9, the CVD apparatus 400 includes a processing vessel 411 evacuated by a dry pump not illustrated, wherein the processing vessel 411 accommodates therein a stage 412, in which a heater mechanism 412A is provided.

Further, there is provided a showerhead 413 in the processing vessel 411 so as to face the substrate (not shown) on the stage 412, wherein the shower head 413 supplies a gaseous precursor compound of Cu to the surface of the substrate held on the stage 412. Further, a hydrogen ($H_2$) gas is supplied to the processing vessel 411 from a line 411A in advance to the commencement of deposition process of the Cu seed layer 29 for the purpose of stabilizing the inner pressure of the processing vessel 411.

The Cu precursor compound is held in a source container 414 in the form of a liquid, wherein an Ar gas supplied to the source container 414 presses the liquid precursor compound out to a precursor supply line 415 having a valve 415A and held at a predetermined temperature.

The liquid precursor compound thus pressed out to the line 415 is supplied, after passing through a mass flow controller 415B and a valve 415C controlled by the mass flow controller 415B, to a vaporizer 416. In the case the compound $Cu^{+1}$ (hexafluoroacetylacetonato) trimethylvinylsilane (Cu(hfac)TMVS) is used for the precursor compound, the vaporizer 416 is held at the temperature of 50-70° C. Further, the precursor supply line 415 is provided with a drain valve 415D.

In the vaporizer 416, the precursor compound is sprayed in the form of mist or gas and is supplied to the shower head 413 in the processing vessel 411 via a valve 416C, together with a sweep gas of $H_2$ supplied from a line 416A via a valve 416B at the temperature of room temperature or 60° C. Thereby, the gaseous source supply line 416D including the valve 416C and extending from the vaporizer 416 to the processing vessel 411 is held at the temperate generally equal to the temperature of the vaporizer, in the case the Cu(hfac)TMVS is used for the precursor of Cu, so as to avoid condensation of the vaporized precursor compound. Further, the shower head 413 is held at the temperature of 50-70° C., and the processing vessel 411 itself is held at the temperature generally equal to that of the shower head.

It should be noted that the precursor supply line 415 is provided with a drain, and the vaporizer 416 is evacuated by a dry pump (not shown) via a valve 416E. Thereby, the TMVS adducts decoupled from the Cu precursor compound is removed.

By using the CVD apparatus of FIG. 9, deposition of the Cu seed layer 29 is achieved in the processing vessel 411 according to the reaction

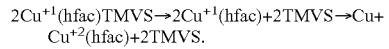

It should be noted that the Cu seed layer 29 can be formed also by a PVD process.

Figure 6H:
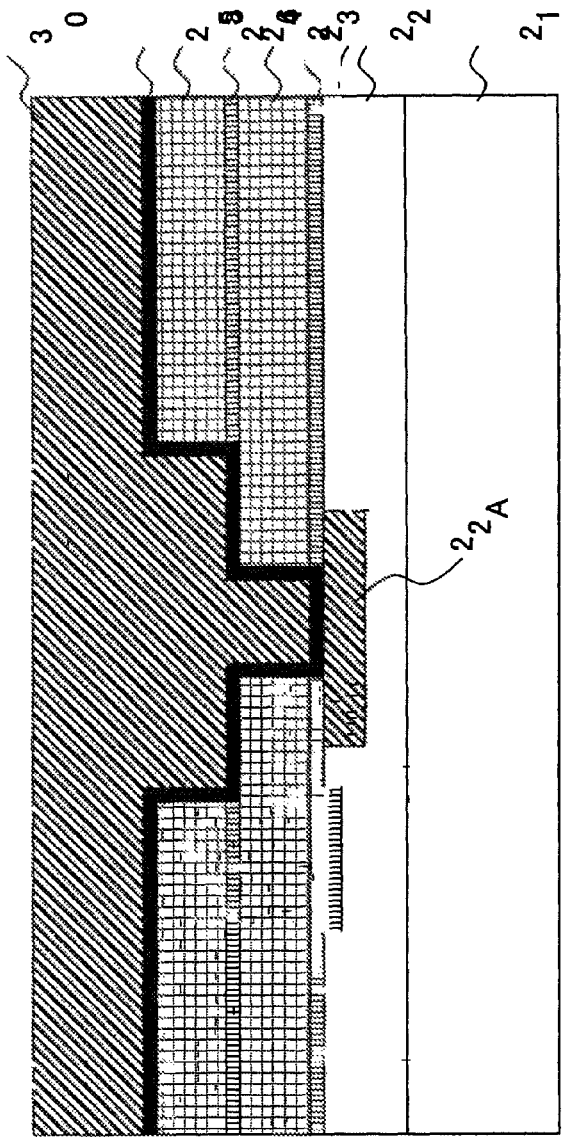

After the step of FIG. 6G, the substrate is moved to a plating apparatus in the step of FIG. 6H, and a Cu layer 30 is formed on the Cu seed layer 29 by electrolytic or non-electrolytic plating process.

Figure 6I:
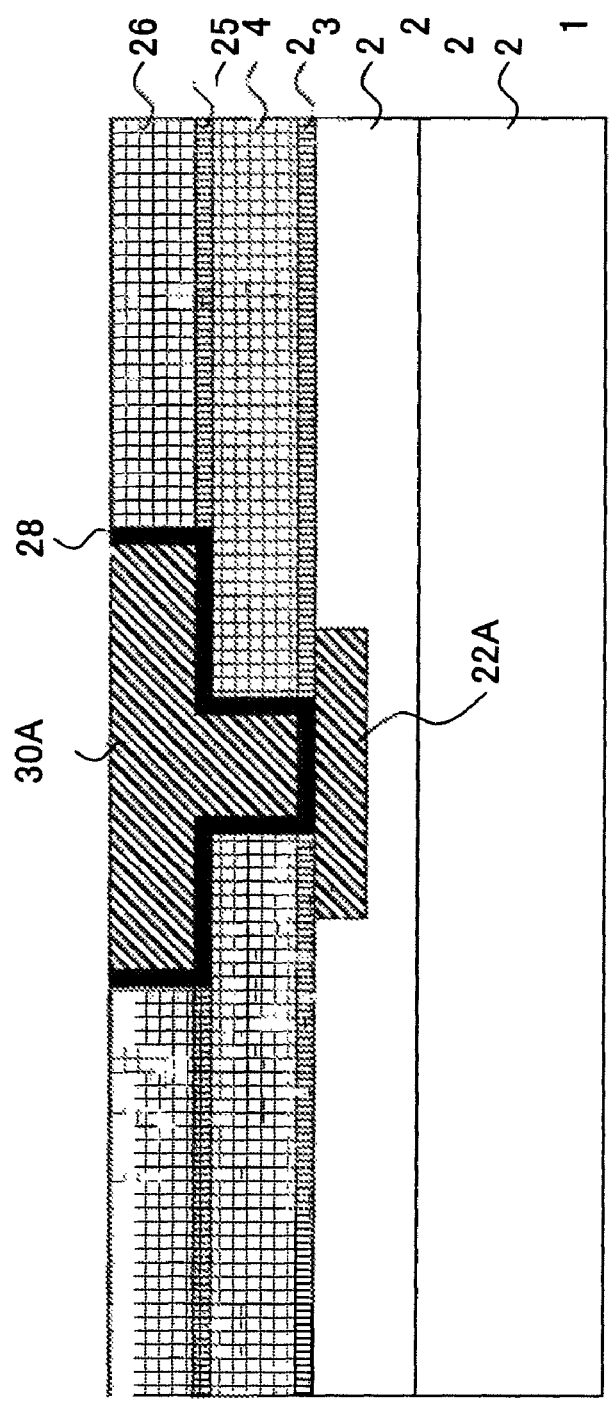

Further, after the thermal annealing process, the Cu layer 30 and the barrier metal film 28 on the interlayer insulation film 26 are polished out by a CMP process in the step of FIG. 6I, and an interconnection structure in which the interconnection trench 26A and the via-hole 24A are filled with Cu is obtained.

Figure 10:
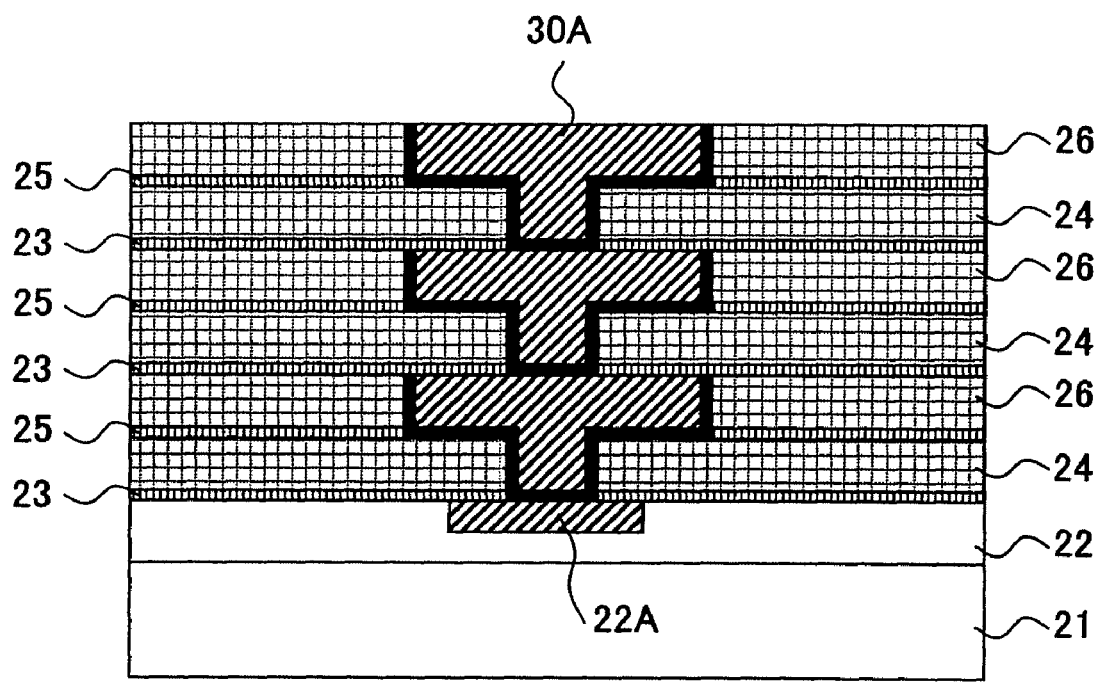
FIG. 10 is a diagram showing a multilayer interconnection structure obtained with the first embodiment of the present invention.

Further, by repeating the steps of FIGS. 6A-6I, a multilayer interconnection structure shown in FIG. 10 is obtained in which it will be noted that the structure of FIG. 6I is repeated.

With the present embodiment, the surface of the interlayer insulation film 26, the sidewall surface and bottom surface of the interconnection trench 26A, and the sidewall surface and the bottom surface of the via-hole 24A are subjected to pre-processing in the step of FIG. 6E before formation of the barrier metal film 28 by using the high-density plasma of low-electron density, and thus, damaging of the interlayer insulation films 24 and 26 is avoided. Further, there is caused no local modulation of film density, and hence specific dielectric constant, by the sputtering of the functional groups in the film.

Further, there occurs no problem such as the Cu interconnection pattern 22A exposed at the bottom of the via-hole 24A experiences sputtering, and thus, there occurs no problem that sputtered Cu or Cu oxide causes adherence to the sidewall surface of the via-hole 24A or interconnection trench 26A. Thereby, diffusion of the Cu atoms into the interlayer insulation film 24 or 26 is positively prevented.

While the foregoing explanation has been made for the case the interlayer insulation films 24 and 26 are formed of an SiOCH film formed by a plasma CVD process, the present invention is by no means limited to such a specific composition of the interlayer insulation film.

Generally, a low-K dielectric film used for the interlayer insulation film 24 or 26 is classified into an inorganic film and an organic film. In the case of an inorganic film, it is possible to use an inorganic SOD film (inorganic insulation film formed by a spin-on process) such as alkyl siloxane polymer, HSQ (hydrogen silsesquioxane), or the like. Further, it is also possible to form a low dielectric inorganic film by CVD process. For example, it is possible to use a fluorine-doped silicon oxide film.

Further, it is possible in any of these inorganic film or silicon oxide film to reduce the dielectric constant further, by forming the film to have a porous structure. It should be noted that the present invention is effective also in such a case of using porous film.

In the case of using an organic film for the interlayer insulation films 24 and 26, it is possible to use an organic polymer film such as a PTFE film, a polyimide film, fluorine-doped polyimide film, a BCB (benzocyclobutene) film, a parylene-N film, a parylene-F film, an MSQ (alkyl silsesquioxane polymer) film, a HOSP (hydro-organic silsesquioxane) film, and the like. Further, the organic film includes fluorine-doped carbon film or DLC (diamond-like carbon) film, a SiCO film or SiCO(H) film. Also in the case of using these organic films, the dielectric constant can be reduced further by forming the film as a porous film. The present invention is effective also in these cases.

Further, in the step of FIG. 6G, too, it is possible to form the Cu seed layer 29 by a PVD process such as sputtering process.

Further, it is possible, in the formation of the barrier metal film 28 in the step of FIG. 6F, to carry out the formation of the Ta film by a PVD process such as sputtering process. Further, it is also effective to form the TaN film by an ALD process and form the Ta film by a PVD process.

It is further possible to carry out the plasma processing step of FIG. 6E and the formation step of the barrier metal film 28 of FIG. 6F in the same processing vessel. However, in view of different processing temperatures between the step of FIG. 6E and FIG. 6F, it is preferable to carry out these processed in different processing vessels. Further, in view of the fact that it is preferable to carry out the formation of the barrier metal film of FIG. 6F right after the preprocessing step of FIG. 6E without exposing the substrate to the air, it is preferable that these separate processing vessels are coupled with each other by a vacuum transportation chamber.

Further, because the formation step of the Cu seed layer 29 of FIG. 6G is conducted in a lower pressure ambient as compared with the preprocessing step of FIG. 6E or the ALD step of FIG. 6F, it is preferable to carry out the process of FIG. 6G in a separate processing vessel coupled to the foregoing vacuum transportation chamber via another vacuum transportation chamber of higher degree of vacuum for improving the processing efficiency. This applies also to the case in which the formation of the Cu seed layer 29 is conducted by a PVD process and the case in which the formation of the Ta film is conducted by a PVD process.

Second Embodiment

Figure 11B:
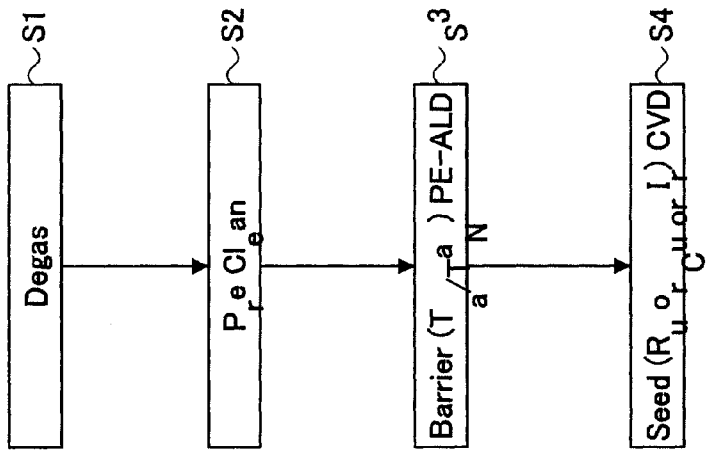
FIG. 11B is a diagram showing a substrate processing sequence conducted with the system of FIG. 11A.
Figure 11A:
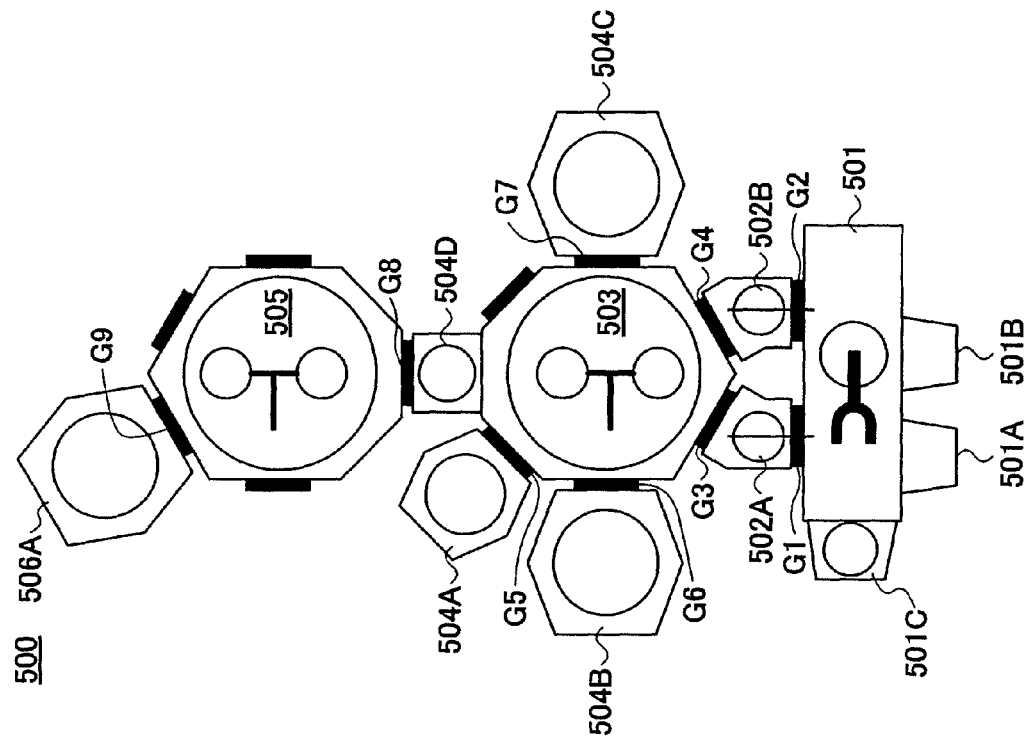

FIG. 11A is a construction of a clustered substrate processing system 500 suitable for performing the process of the present invention efficiently while FIG. 11B shows the flow of the substrate processing carried out in the substrate processing system 500.

Referring to FIG. 11A, the substrate processing system 500 includes an inlet-side wafer transportation chamber 501, which in turn includes cassette modules 501A and 501B and a wafer orienting unit 501C that detects the orientation flat or notch of wafer and aligns the wafer orientation properly. Further, load-lock chambers 502A and 502B are coupled to the foregoing inlet-side wafer transportation chamber 501 via gate valves G1 and G2, respectively. It should be noted that the inlet-side wafer transportation chamber 501 is in the state of an atmospheric pressure and holds the wafer therein in clean state.

The load lock chambers 502A and 502B are coupled to a vacuum wafer transportation chamber 503 accommodating therein a wafer transportation robot via respective gate valves G3 and G4, wherein the vacuum wafer transportation chamber 503 is coupled with a degassing processing chamber 504A, a preprocessing chamber 504B accommodating therein the microwave plasma processing apparatus 10 of FIGS. 4 and 5, and a barrier metal formation chamber 501C accommodating therein the deposition apparatus 300 of FIG. 7, via respective gate valves G5, G6 and G7.

Further, the vacuum wafer transportation chamber 503 is coupled with a second vacuum wafer transportation chamber 505 accommodating therein a wafer transportation robot via a wafer handling chamber 504D and a gate valve G8, and a CVD chamber 506A carrying out the formation the Cu seed layer 29 of FIG. 6G is coupled to the vacuum wafer transportation chamber 505 via a gate valve G9.

Here, it should be noted that the vacuum wafer transportation chamber 503 is held at a relatively high pressure of about $10^{-6}$ Torr in correspondence to the processing in the chambers 504A-504C, while the vacuum wafer transportation chamber 505 is held at a lower pressure of $10^{-7}$ Torr or less in correspondence to the processing in the processing chamber 506A. Further, by setting the pressure of the vacuum transportation chamber 505 equal to or lower than the pressure of the vacuum transportation chamber 503, it is possible to avoid occurrence of contamination caused by the ambient in the vacuum transportation chamber 505 invading into the vacuum transportation chamber 503.

Referring to the flowchart of FIG. 11B, the cassette module 501A or 501B holds therein the wafer in the sate of FIG. 6D, and the wafer is introduced into the vacuum wafer transportation chamber 503 from the inlet-side wafer transportation chamber 501 via the gate valve G1 and the load lock chamber 502A or via the gate valve G2 and the load lock chamber 502B, after orienting step in the wafer orienting unit 501C. The wafer is then forwarded from the vacuum wafer transportation chamber 503 to the degassing processing chamber 504A via the gate valve G5. In the degassing processing chamber 504A, heating processing or ultraviolet irradiation process may be conducted in an inert gas ambient.

After degassing processing in the degassing processing chamber 504A for removal of water in the air or residual gas in the film from the substrate, the wafer is returned to the vacuum wafer transportation chamber 503 via a gate valve G5, and in the step 2, the wafer is transported to the preprocessing chamber 504B via the gate valve G6. Thereby, the preprocessing corresponding to the step of FIG. 6E is conducted.

Next, after preprocessing in the preprocessing chamber 504B, the wafer is returned to the vacuum wafer transportation chamber 503 via the gate valve G6, wherein the wafer is transported further to the film formation chamber 504C in the step 3 via the gate valve G7. There, formation of the barrier metal film 28 is conducted according to the ALD process in correspondence to the step of FIG. 6F.

After formation of the barrier metal film 28 in the film forming processing chamber 504C, the wafer is returned to the vacuum wafer transportation chamber 503 via the gate valve G7 and is further transported to the vacuum wafer transportation chamber 505 from the wafer handling chamber 504D via the gate valve G8.

The wafer thus introduced into the vacuum wafer transportation chamber 505 is then introduced in to the CVD chamber 506A via the gate valve G9 in the step 4, and the Cu seed layer 29 is formed in correspondence to the step of FIG. 6G.

After formation of the Cu seed layer 29, the wafer is returned to the vacuum wafer transportation chamber 505 via the gate valve G9 and further to the vacuum transportation chamber 503 via the gate valve G8 and the wafer handling chamber 504D. Further, the wafer is returned to the inlet-side wafer transportation chamber 501 from the vacuum transportation chamber 503 via the gate valve G3, load lock chamber 502A and the gate valve G1, or via the gate valve G4, the load lock chamber 502B and the gate valve G2. Thereafter, the wafer is returned to the cassette module 501A or 501B.

With such a construction, the degassing process, the preprocessing of FIG. 6E and barrier metal film formation of FIG. 6F, which have to be conducted continuously but at different temperatures, are carried out by different processing chambers coupled to the vacuum wafer transportation chamber 503, and the time needed for raising and lowering the substrate temperature is reduced. Thereby, efficient substrate processing can be achieved.

Further, the step of formation of the Cu seed layer of FIG. 6G, which has to be conducted under a significantly different processing pressure, is carried out in the processing chamber 506A coupled to the vacuum wafer transportation chamber 505 held at a lower pressure, and thus, the magnitude of pressure adjustment at the time of moving in and out the wafer to and from the processing chamber is reduced as compared with the case of using a single vacuum wafer transportation chamber. Thereby, efficient substrate processing is achieved.

Further, it should be noted that the substrate processing system 500 of FIG. 11A is effective not only for formation of multilayer interconnection structure explained before but also for formation of ferroelectric memory devices in which a metal electrode of Ru, Ir, or the like, is formed on an interlayer insulation film via a barrier metal film of Ta/TaN structure and a ferroelectric film is formed further thereon.

Third Embodiment

FIG. 12A is a diagram showing the construction of a substrate processing system 600 according to a third embodiment of the present invention, wherein those parts corresponding to the parts described previously are designated by the same reference numerals.

Referring to FIG. 12A, the system of the present embodiment has a construction in which the CVD chamber 506A is eliminated and a PVD chamber 506B is coupled to the vacuum wafer transportation chamber 505 via a gate valve G10, wherein the PVD chamber 506B carries out the formation process of the Cu seed layer 29 of FIG. 6G by way of a sputtering process.

FIG. 12B shows the flow of the substrate processing carried out by using the substrate processing system 600 of FIG. 12A.

Referring to FIG. 12B, a degassing step 11 corresponding to the step 1 of FIG. 11B and the preprocessing step 12 corresponding to the step 2 of FIG. 11B are carried out at first, and a barrier metal film 28 is formed in the step 13 by way of the ALD process of Ta film or TaN film or by way of the ALD process that forms a lamination of a TaN film and a Ta film.

In the case of forming the barrier metal film 28 solely by a Ta film, the sequence of formation of Ta film explained before is repeated until a desired film thickness is attained. In the case of forming the barrier metal film 28 solely by the TaN film, the sequence of formation of TaN film explained previously is repeated until a desired film thickness is attained.

After the step 13, the present embodiment returns the wafer from the processing chamber 504C to the vacuum wafer transportation chamber 503 via the gate valve G7, and the wafer is transported further to the vacuum transportation chamber 505 of higher degree of vacuum in the step 14 via the wafer handling chamber 504D and the gate valve G8. Further, the wafer is transported to the PVD chamber 506B via the gate valve G10, and the Cu seed layer 29 is formed by a sputtering process.

Generally, sputtering method requires an ambient pressure of $10^{-8}$ Torr or less. Thus, in the case such a sputtering chamber is coupled to the vacuum wafer transportation chamber 503 of the ambient pressure of about $10^{-6}$ Torr, a long time is needed for evacuating the processing chamber until the processing can be started. In the case of the present embodiment, the sputtering chamber 506B is coupled to the substrate transportation chamber 505 of higher degree of vacuum, and thus, there arises no such a problem.

Other features of the present embodiment are substantially the same to those of the previous embodiments, and further explanation will be omitted.

Fourth Embodiment

Figure 13B:
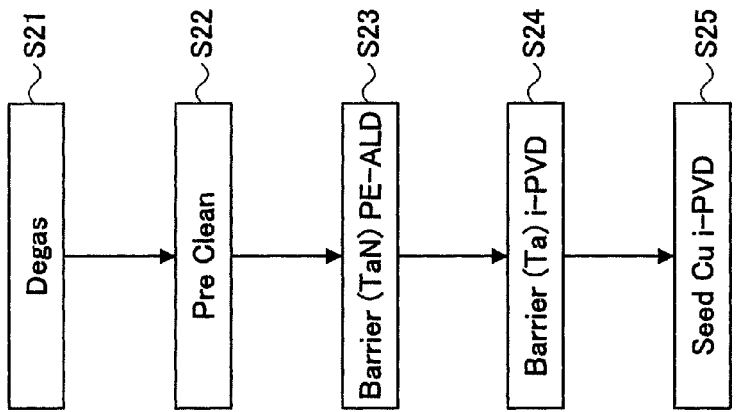
FIG. 13B is a flowchart showing a substrate processing sequence conducted with the system of FIG. 13A.
Figure 13A:
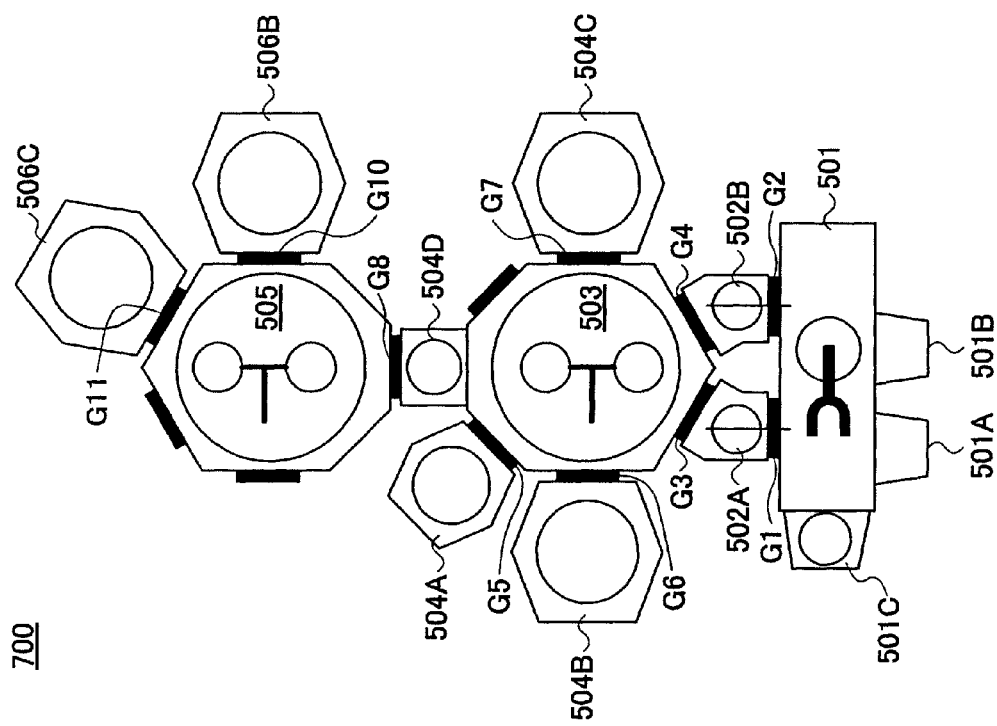

FIG. 13A is a diagram showing the construction of a substrate processing system 700 according to a fourth embodiment of the present invention, wherein those parts corresponding to the parts described previously are designated by the same reference numerals.

Referring to FIG. 13A, the system of the present embodiment has a construction in which the CVD chamber 506A is eliminated similarly to the embodiment of FIG. 12A and the PVD chamber 506B is coupled to the vacuum wafer transportation chamber 505 via a gate valve G10. Further, a PVD chamber 506C is coupled to the vacuum wafer transportation chamber 505 via a gate valve G11 wherein the PVD chamber 506C carries out the formation process of the Ta film of FIG. 6F by way of a sputtering process.

In the present embodiment, too, the pressure in the vacuum wafer transportation chamber 505 is set equal to or smaller than the pressure of the vacuum wafer transportation chamber 503 for suppressing the contamination caused by the ambient in the vacuum wafer transportation chamber 505 invading into the vacuum wafer transportation chamber 503.

FIG. 13B shows the flow of the substrate processing carried out by using the substrate processing system 700 of FIG. 13A.

Referring to FIG. 13B, a degassing step 21 corresponding to the step 1 of FIG. 11B and the preprocessing step 22 corresponding to the step 2 of FIG. 11B are carried out at first, and the barrier metal film 28 is formed first in the step 23 by an ALD process of a TaN film and then in the step 24 by a PVD process of a Ta film. Thus, the barrier metal film 28 is formed as a lamination of the TaN film and the Ta film.

More specifically, the wafer in the state of FIG. 6E is introduced into the deposition apparatus 504C in the step 23 and the TaN film constituting a part of the barrier metal film 28 is formed by carrying out the ALD process as explained with reference to the first embodiment.

After the step 23, the present embodiment returns the wafer from the processing chamber 504C to the vacuum wafer transportation chamber 503 via the gate valve G7, and the wafer is transported further to the vacuum transportation chamber 505 of higher degree of vacuum in the step 24 via the wafer handling chamber 504D and the gate valve G8. Further, the wafer is transported to the PVD chamber 506C via the gate valve G11, and the Ta film mentioned before is formed by a sputtering process on the TaN film formed already. With this, formation of the barrier metal film 28 in the step of FIG. 9F is completed.

Next, in the step 25, the wafer of the state of FIG. 9F formed with the barrier metal film 28 is returned to the vacuum transportation chamber 505 via the gate valve G11 and the wafer thus returned is further transported to the PVD chamber 506B via the gate valve G10. Thereby, the Cu seed layer 29 is formed on the barrier metal film 28 on the structure of FIG. 6G.

In the present embodiment, too, the PVD chambers 506B and 506C that require high degree of vacuum are coupled to the vacuum substrate transportation chamber 505 of high degree of vacuum separated from the vacuum substrate transportation chamber 503 of low degree of vacuum via the gate valve G8, and thus, the time needed for pressure adjustment at the time of in and out of wafer to and from the PVD apparatus 506B and 506C is reduced, and efficient substrate processing becomes possible.

In the present embodiment, it is preferable to employ an ionized PVD processing for the PVD processing and a plasma ALD processing for the ALD processing.

Fifth Embodiment

In the foregoing explanation, the preprocessing of FIG. 6E under low-energy plasma is conducted by the microwave plasma processing apparatus 10 explained with reference to FIGS. 4 and 5, while the present invention is by no means limited to such a specific plasma processing apparatus.

Figure 14:
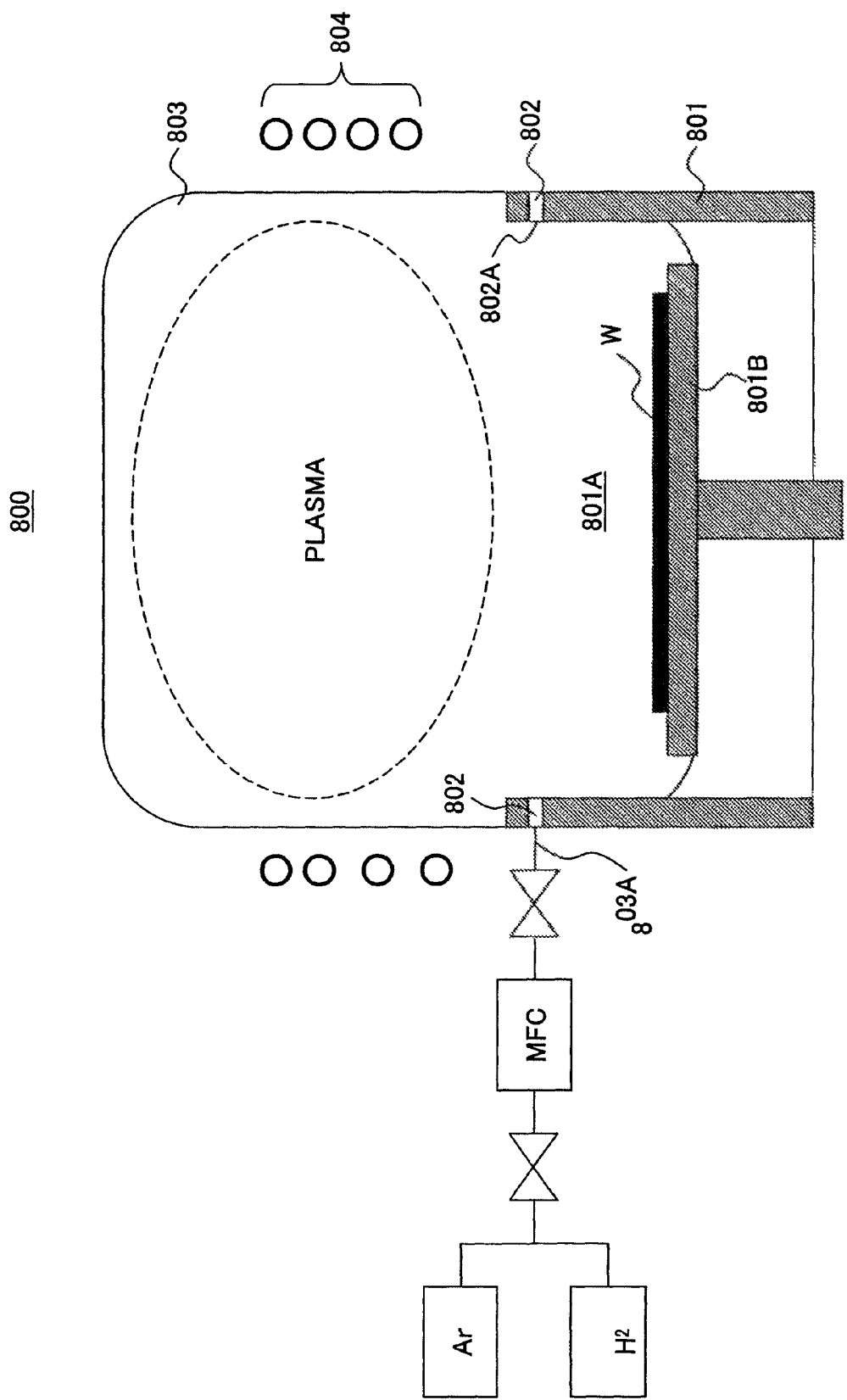
FIG. 14 is a diagram showing an ICP substrate processing apparatus used with a fifth embodiment of the present invention.

FIG. 14 shows the construction of an ICP (induction-coupled plasma) plasma processing apparatus 800 that can be used in the step of FIG. 6E as the low-energy plasma source.

Referring to FIG. 14, the plasma processing apparatus 800 has a processing vessel 801 defining a processing space 801A, and a stage 801B holding thereon a substrate W is provided within the processing vessel 801.

At the top part of the processing vessel 801, there is provided a gas inlet part 802 having a large number of gas outlet openings 802A, and a bell jar 803 of a quartz glass is provided on the gas inlet part 802. Further, the bell jar 803 is formed with a gas inlet opening 803A for supplying a rare gas such as Ar and a processing gas such as hydrogen. Further, an RF induction coil 804 is wound around the bell jar 803.

Thus, by supplying an Ar gas from the gas inlet opening 803A into the bell jar 803 at the substrate temperature of 50-250° C. under the pressure of 1.33-1330 Pa (0.001-10 Torr) with the flow rate of 100-1000 SCCM, or alternatively supplying a He gas in place of the Ar gas with the flow rate of 100-1000 SCCM, together with a hydrogen gas with the flow rate of 100-1000 SCCM, and further energizing the coil 804 with an RF energy of 450 kHz in frequency with the power of 500-5000 W, for example, the impurities such as organic groups adhered to the surface of the interlayer insulation film 26, the sidewall surface and bottom surface of the interconnection trench 26A and further to the sidewall surface and bottom surface of the via-hole 24A are removed, and the oxide layer on the surface of the Cu pattern 22A exposed at the bottom of the via-hole 24B is reduced.

Further, the plasma thus formed has a low electron density of 3 eV or less, and thus, it is possible to avoid damaging of the surface of the interlayer insulation films 24 and 26. Associated with this, there arises no problem that the Cu pattern 22A is sputtered by the plasma. Because the plasma is formed under the condition that the flow rate of $H_2$ is larger than the flow rate of Ar, no sputtering takes place at the surface of the Cu interconnection pattern 22A.

Sixth Embodiment

Figure 15:
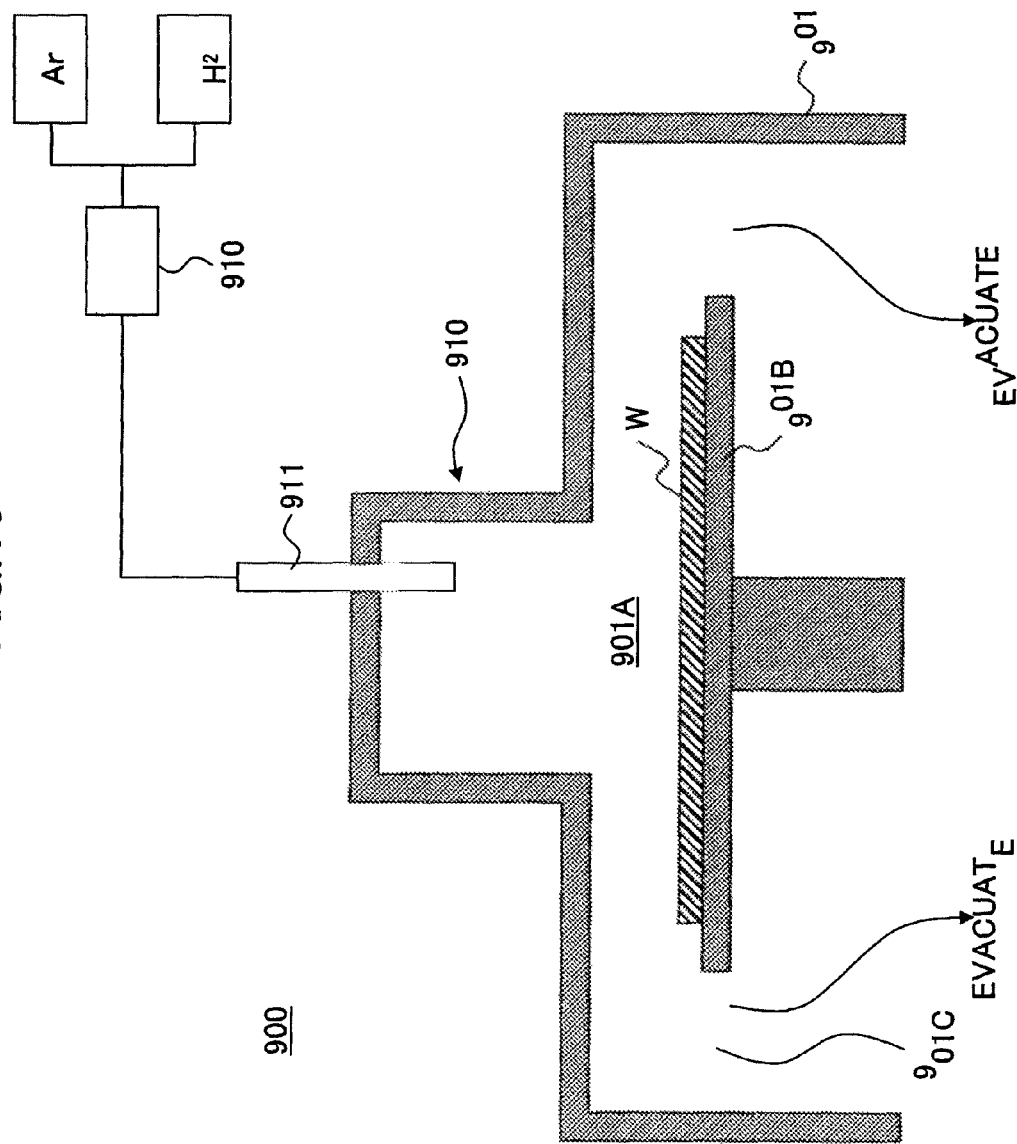
FIG. 15 is a diagram showing a substrate processing apparatus according to a sixth embodiment of the present invention that uses a remote plasma source.

Further, it is possible to carry out the preprocessing step of FIG. 6E by a substrate processing apparatus 900 having a remote plasma source 910 shown in FIG. 15.

Referring to FIG. 15, the substrate processing apparatus 900 has a processing vessel 901 defining a processing space 901A and accommodating therein a stage 901B for holding a substrate W to be processed thereon, wherein it will be noted that there is formed an evacuation port 901C in the processing vessel 901 between the processing vessel 901 and the stage 901B.

Further, with the construction of FIG. 15, there is provided a remote plasma source 910 on a part of the processing vessel 901, wherein the remote plasma source 910 induces plasma by exciting the processing gas containing Ar or He and further hydrogen supplied from the gas line 911 with the RF energy.

Thus, with the present embodiment, the substrate 21 of the sate of FIG. 6D is introduced into the substrate processing apparatus 900 as the substrate W to be processed. Thereby, by causing to act the plasma excited in the processing vessel 901 by the remote plasma source 910, it becomes possible to remove the impurities such as organic functional groups adhered to the surface of the interlayer insulation film 26, the sidewall surface and bottom surface of the interconnection trench 26A and the sidewall surface and bottom surface of the via-hole 24A.

Thereby, by suppressing the electron temperature of the plasma to be 3 eV or less, damaging of the interlayer insulation films 24 and 26 is avoided, and there occurs no problem of increase of the specific dielectric constant. Further, there occurs no problem of the Cu interconnection pattern 22A exposed at the bottom of the via hole 24A being sputtered by the plasma.

Such remote plasma can be formed under the pressure of 13.3-133 Pa by supplying an Ar gas with the flow rate of 100-500 SCCM or a He gas with the flow rate of 100-500 SCCM and further a hydrogen gas with the flow rate of 1000 SCCM and supplying an RF power of the frequency of 13.56 kHz with the power of 500-2000 W.

Because the plasma contains hydrogen, the surface of the interlayer insulation film 26, the sidewall surface and bottom surface of the interconnection trench 26A and the sidewall surface and bottom surface of the via-hole 24A are terminated with hydrogen, and adherence of impurities is suppressed.

Figure 16A:
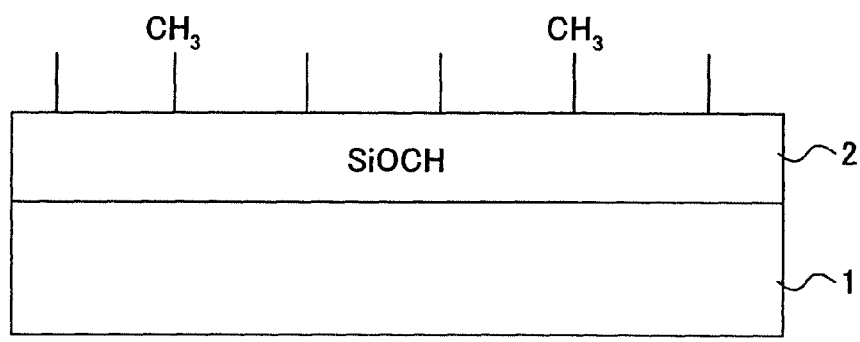
FIGS. 16A and 16B are diagrams showing plasma processing of a low-K dielectric film according to the present invention.
Figure 16B:
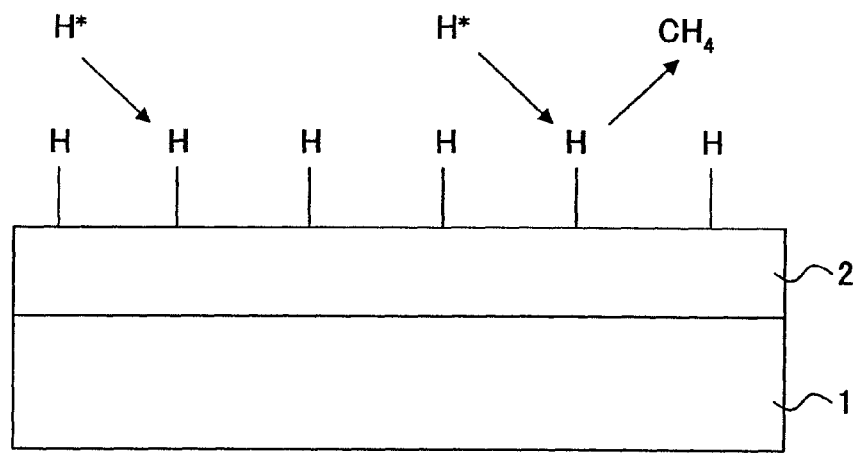

While the present invention has been explained for the case of forming a multilayer interconnection structure having a low-K dielectric film, the present invention can be used also for cleaning of a low-K dielectric film 2 such as an SiOCH film formed on an underlying film 1 for removing impurities such as organic functional groups adsorbed upon the surface of the film 2 as shown in FIG. 16A, without causing damaging in the film 2 as shown in FIG. 16B, and without increasing the specific dielectric constant, while terminating the surface by hydrogen at the same time.

Further, while the previous embodiment has been explained for the case the barrier metal film is any of a TaN film or a Ta film or lamination of a TaN film and a Ta film, the present invention is effective also for the case of other barrier metal films such as a Ti film or TiN or Ru film.

Further, the present invention is not limited to the embodiments described heretofore, but various variations and modifications may be made without departing from the scope of the invention.

Seventh Embodiment

Figure 17A:
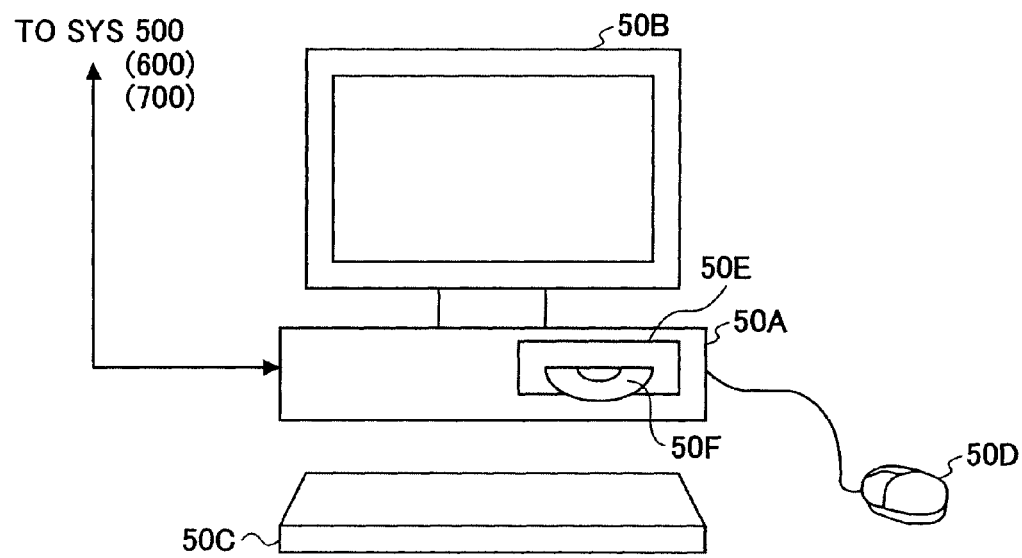
FIGS. 17A and 17B are diagrams showing a computer according to a seventh embodiment of the present invention.
Figure 17B:
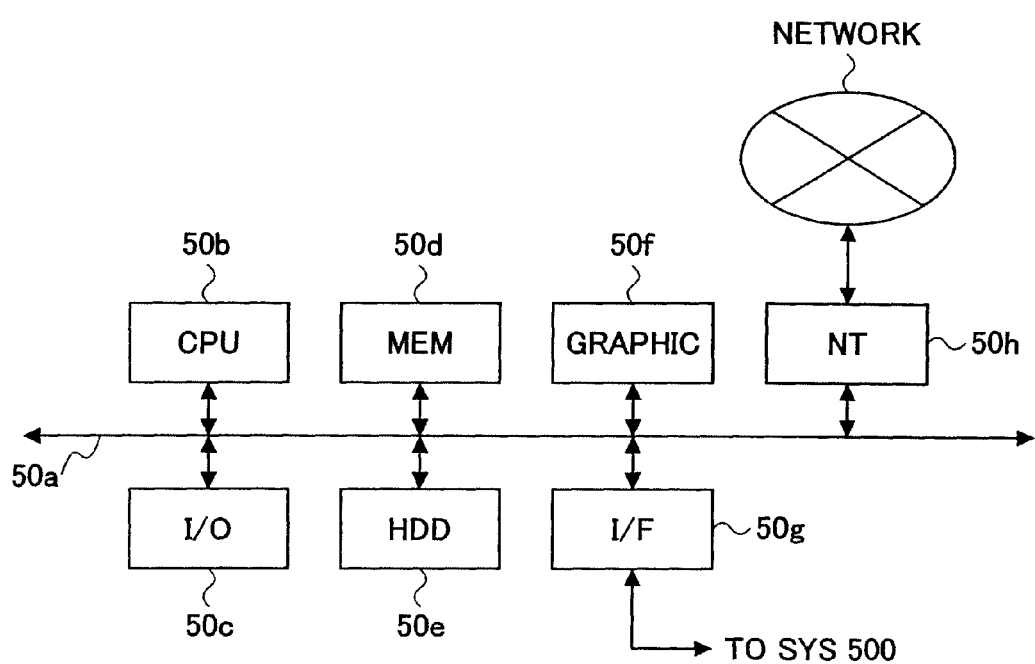

FIGS. 17A and 17B show a computer 50 used for controlling the substrate processing system 500 for causing the substrate processing system 500 to carry out the processing shown in FIG. 11B.

Referring to FIG. 17A, the computer 50 includes a main unit 50A, a display unit 50B, a key board 50C and a pointing device SOD, wherein there is provided a disk drive 50E in a part of the main unit 50A for reading and writing information to and from a medium 50F such as a floppy disk or optical disk.

FIG. 17B shows the schematic block diagram of the computer 50.

Referring to FIG. 17B, the computer 50 includes a system bus 50a to which various units such as CPU 50b, an I/O unit 50c, a memory unit 50d, a disk drive unit 50e, a graphic controller 50f, an interface card 50g, a network card 50h, and the like are connected.

Thus, upon turning on of the computer 50, or in response to the command given by the operator, the I/O unit reads the program code recorded on the medium 50F under control of the CPU 50b and expands the program and data in the memory unit 50d and the disk drive unit 50e.

Further, the CPU 50b carries out the program and controls the substrate processing unit 500 via the interface card 50g with regard to the heater temperature, RF power output, pressure of the processing space, the wafer transportation robot, or the like, and with this, the substrate processing system 500 performs the operation explained with reference to FIG. 11B.

Thereby, the processing result or status of the processing is displayed on the display unit 50B via the graphic controller 50f.

With the computer 50 of FIGS. 17A and 17B, it is also provide the control program from a network via the network controller 50h.

Further, the computer 50 of FIGS. 17A and 17B can be used also with the substrate processing system 600 or 700 for performing the processing of FIG. 12B or 13B.

Further, the computer 50 can be used for controlling the operation of the substrate processing apparatuses of FIG. 4, FIG. 7, FIG. 9, FIG. 14 and FIG. 15 in their standalone state.

The present invention is based on Japanese priority application 2004-164521 filed on Jun. 2, 2004, the entire contents of which are incorporated herein as reference.

This application is related to U.S. Ser. No. 11/142,457, filed Jun. 2, 2005 the entire contents of which are incorporated herein by reference, and claims priority under 35 U.S.C. §121 to this application.

What is claimed is:

1. A method of fabricating a semiconductor device, comprising:
    forming a via-hole in an interlayer insulation film containing a methyl group such that a metal interconnection pattern formed underneath said interlayer insulation film is exposed at a bottom of said via-hole;
    forming a conductive barrier film on said interlayer insulation film so as to cover a sidewall surface of said via-hole and said exposed metal interconnection pattern in conformity with a shape of said via-hole; and
    forming a metal film on said conductive barrier film,
    wherein there is provided a preprocessing step,
    after said forming said via-hole but before said forming said conductive barrier film, processing said interlayer insulation film including said sidewall surface of said via-hole and a bottom surface of said via-hole, with plasma containing hydrogen having energy not causing sputtering of said metal interconnection pattern, such that a surface of said interlayer insulation film, said sidewall surface of said via-hole and said bottom surface of said via-hole are terminated by hydrogen,
    wherein said plasma in said preprocessing step is a mixed gas plasma of a rare gas and a reducing gas containing hydrogen,
    said plasma has an electron temperature not exceeding 3 eV, and
    said plasma is excited by radiating a microwave from a planar antenna.

2. The method as claimed in claim 1, wherein said forming said conductive barrier film comprises covering said surface of said interlayer insulation film with a conductive nitride film including said sidewall surface and bottom surface of said via-hole, and covering said conductive nitride film by a refractory metal film.

3. The method as claimed in claim 2, wherein said forming said conductive nitride film comprises:
    a first step covering said surface of said interlayer insulation film and said sidewall surface and bottom surface of said via-hole by organic metal source molecules containing nitrogen; and a second step decomposing said organic metal source molecules, said first step and said second step being repeated with intervening purging steps.

4. The method as claimed in claim 3, wherein said forming said refractory metal film comprises a third step covering a surface of said conductive nitride film with metal source molecules containing a refractory metal element constituting said refractory metal film and a fourth step decomposing said metal source molecules, said third step and said fourth step being repeated with intervening purging steps.

5. The method as claimed in claim 1, wherein said interlayer insulation film is an SiOCH film formed by plasma CVD process.

6. The method as claimed in claim 1, wherein said interlayer insulation film is an inorganic SOD film.

7. The method as claimed in claim 1, wherein said interlayer insulation film comprises an organic polymer film.

8. The method as claimed in claim 1, wherein said interlayer insulation film is a porous film.

9. The method as claimed in claim 1, wherein said forming said conductive barrier film is carried out in a first processing vessel, and wherein said forming said metal film is conducted in a second processing vessel connected to said first processing vessel via a vacuum substrate transportation chamber.

10. The method as claimed in claim 1, wherein said planar antenna comprises a radial line slot antenna.

11. The method as claimed in claim 1, wherein said planar antenna is provided at a top part of a processing vessel in which said preprocessing step is carried out.

12. A substrate processing method, comprising:
    forming a via-hole in an insulation film containing a methyl group so as to expose a metal pattern formed underneath said insulation film at a bottom of said via-hole; and
    forming a conductive barrier film on said insulation film in conformity with a shape of said via-hole such that conductive barrier film covers a sidewall surface of said via-hole and said metal pattern exposed at said bottom of said via-hole,
    wherein there is provided a preprocessing step, after said forming said via-hole but before said forming said conductive barrier film, processing said interlayer insulation film including said sidewall surface of the via-hole and a bottom surface of said via-hole, with plasma containing hydrogen having energy not causing sputtering of said metal pattern, such that a surface of said interlayer insulation film is terminated with hydrogen including said sidewall surface of said via-hole and said bottom surface of said via-hole,
    wherein said plasma in said preprocessing step is a mixed gas plasma of a rare gas and a reducing gas containing hydrogen,
    said plasma has an electron temperature not exceeding 3 eV, and
    said plasma is excited by radiating a microwave from a planar antenna.

* * * * *